United States Patent [19]

Ishikawa et al.

[11] Patent Number: 5,656,098
[45] Date of Patent: Aug. 12, 1997

[54] PHOTOVOLTAIC CONVERSION DEVICE AND METHOD FOR PRODUCING SAME

[75] Inventors: Nobuyuki Ishikawa, Yokohama; Keishi Saito, Nagahama; Soichiro Kawakami, Hikone; Jinsho Matsuyama, Nagahama; Toshimitsu Kariya, Nagahama; Yuzo Kouda, Nagahama; Naoto Okada, Nagahama, all of Japan

[73] Assignee: Canon Kabushiki Kaisha, Tokyo, Japan

[21] Appl. No.: 456,403

[22] Filed: Jun. 1, 1995

Related U.S. Application Data

[62] Division of Ser. No. 24,252, Mar. 1, 1993, Pat. No. 5,421,909.

[30] Foreign Application Priority Data

Mar. 3, 1992 [JP] Japan ................ 4-81716

[51] Int. Cl.$^6$ .................. H01L 31/04; H01L 31/18
[52] U.S. Cl. ............. 136/256; 136/259; 427/74; 427/212; 427/214; 427/221; 257/436; 438/57; 438/64
[58] Field of Search ............... 437/2–5, 225, 437/235, 243; 427/74, 212, 214, 221; 136/256, 258 AM, 259; 257/436

[56] References Cited

U.S. PATENT DOCUMENTS

| | | | |
|---|---|---|---|
| 4,406,913 | 9/1983 | Weyrich | 136/259 |
| 4,780,752 | 10/1988 | Angerstein et al. | 257/788 |
| 5,213,627 | 5/1993 | Marquardt et al. | 136/251 |
| 5,421,909 | 6/1995 | Ishikawa et al. | 136/256 |

FOREIGN PATENT DOCUMENTS

| | | | |
|---|---|---|---|
| 0054157 | 10/1981 | European Pat. Off. | 136/259 |
| 59-73942 | 4/1984 | Japan . | |
| 60-34080 | 2/1985 | Japan | 136/259 |
| 1-077993 | 3/1989 | Japan | 136/259 |
| 1-106472 | 4/1989 | Japan | 136/259 |
| 2098002 | 11/1982 | United Kingdom | 257/788 |

OTHER PUBLICATIONS

Patent Abstracts of Japan, vol. 11, No. 257 (E–534) Aug. 1987.
Patent Abstracts of Japan, vol. 14, No. 451 (E–984) Sep. 1990.
Patent Abstracts of Japan, vol. 14, No. 102 (E–894) Feb. 1990.
Patent Abstracts of Japan, vol. 7, No. 162 (E–187) Jul. 1983.
J. Crystal Growth, vol. 63, No. 3, Oct. 1983, pp. 429–590.
A. Rothwarf, Conference Record, 18th IEEE Photovoltaic Specialists Conf. (1985 pp.809–812.

*Primary Examiner*—Aaron Weisstuch
*Attorney, Agent, or Firm*—Fitzpatrick, Cella, Harper & Scinto

[57] ABSTRACT

A photovoltaic device has a semiconductor layer; electrodes and a surface protection layer adjacent to the light incident side. Granules of a material different from those of the surface protection layer are disposed in the surface protection layer. The granules in the surface protection layer have an average grain size of 0.001–20 microns, a surface density S from 0.2 to 0.9 and/or a density per volume from 0.001 to 0.5.

To produce a surface protecting layer for a photovoltaic device in which the surface protecting layer has granules at a light incident side the surface of a photovoltaic device is painted with a liquid resin containing the granules.

20 Claims, 11 Drawing Sheets

PHOTOVOLTAIC CONVERSION DEVICE AND METHOD FOR PRODUCING SAME

CROSS-REFERENCES TO RELATED APPLICATIONS

This is a division of application Ser. No. 08/024,252 filed Mar. 1, 1993, now U.S. Pat. No. 5,421,909, issued Jun. 6, 1995.

BACKGROUND OF THE INVENTION

1. Field of the Invention

The present invention relates to a photovoltaic device, and more particularly to a surface coating which has excellent weather and impact resistance and which is applied to a photovoltaic device having a semiconductor layer and an electrode layer serving as photoelectric conversion members formed on a base member thereof, and to a photovoltaic device, the output characteristics of which are improved because light to be absorbed by the semiconductor layer can be utilized effectively by scattering of the incident light.

2. Related Background Art

Recently, it has been predicted that the earth will be warmed by a greenhouse effect due to an increase in $CO_2$ and therefore there arises a desire for a clean energy source. Since nuclear power generation has encountered an unsolved problem in disposing of the radioactive waste, greater safety and another source of clean energy have been required. Among the various clean energy sources expected for future use, solar cells have been developed due to cleanness, safety and handling facility.

Of the various materials for solar cells, amorphous silicon and copper indium selenide have been energetically studied because a large cell can be manufactured and the manufacturing cost can be reduced.

The solar cells sometimes use substrates made of metal such as stainless steel because of its capability of reducing weight, excellent weather and impact resistance, and flexibility. If a metal substrate made of, for example, stainless steel is employed, at least the light incident surface must be covered with a coating, which is transparent with respect to visible light, in a manner different from the case in which a glass substrate is employed. As shown in FIG. 13 in a schematic cross-sectional view which illustrates a conventional solar cell module, the conventional solar cell module comprises a solar cell 1300 laminated with fluororesin films 1302 exhibiting excellent weather resistance while interposing adhesive layers 1301 also serving as fillers and made of EVA (ethylene vinyl acetate copolymer).

However, the fact that the EVA and fluororesin film have low hardness causes scratching damage and the like to be easily generated. Accordingly, the EVA layers and the fluororesin films are thickened in order to protect the body of the solar cell from damage. In order to improve the hardness and strength, a structure is sometimes employed in which unwoven glass fabric such as crane glass is used as a filler embedded in the EVA layer. "Crane glass" is a nonwoven fiberglass web produced by Crane and Co., Inc., which is available as a fiberglass sheet 0,127 mm in thickness. However, the weight cannot be reduced if the EVA serving as the adhesive agent and as the filler or the total thickness of the EVA layer and the crane glass is too thick.

In an outdoor experiment to which the resin film laminated-type solar cell module is subjected, small spaces are undesirably formed between the resin film and the adhesive agent for adhering the resin film to the solar cell and therefore the resin film is locally separated.

In order to overcome the foregoing problem, a method has been disclosed in Japanese Patent Laid-Open Application No. 59-73942. Described therein is a process wherein a surface which is in contact with the adhesive layer made of a fluororesin film or an ethylene chloride trifluoride resin film in subjected to RF sputtering etching. Furthermore, the solar cell is covered with the foregoing films and the adhesive agent to improve the adhesive strength. However, the structure is inevitably multi-layer and an RF sputtering etching process must be performed. Therefore, a complicated manufacturing process is required.

Another method for further reducing the weight has been attempted by directly covering the light incident surface of the solar cell with a fluororesin paint exhibiting weather resistance in place of the fluororesin film and the adhesive layer. However, the fact that the fluororesin has insufficient hardness causes a problem of damage. Therefore, the aforesaid method cannot be adapted to a solar cell used outdoors.

A method of improving the photoelectric conversion efficiency of a photovoltaic device such as a solar cell incorporating a semiconductor layer for generating photovoltaic force and electrodes has been disclosed. The method utilizes an arrangement wherein light incident on the photovoltaic device is scattered to lengthen the optical path in the semiconductor layer, to increase the amount of light absorbed in the semiconductor layer, and to increase the short-circuit current.

The structure of the photovoltaic device for scattering light incident on the photovoltaic device is exemplified by: (1) a transparent electrode having projections and pits formed on a transparent substrate such as a glass substrate; (2) a light reflection layer having projections and pits formed on a substrate; and (3) a semiconductor substrate having projections and pits formed therein. The structures using the glass substrate or the semiconductor substrate scatter light on the surface of the light incident side thereof. The structure having projections and pits formed in the light reflection layer scatters the light on the side opposite the light incident side thereof.

The structure incorporating the glass substrate to scatter the light on the surface of the light incident side has an arrangement such that light is incident on the semiconductor layer through the substrate. Therefore, a transparent electrode having projections and pits is formed with heat at a temperature of about 300° C. or more prior to forming the semiconductor layer.

On the other hand, the photovoltaic device having the structure in which light is incident on the semiconductor layer through a portion opposing the substrate is manufactured as follows: first, a thin semiconductor layer is formed on the substrate; and then, the light scattering structure is formed. Therefore, the temperature of the substrate cannot be raised to a level higher than the temperature at which the semiconductor layer is formed, during the forming of the transparent electrode. What is worse, the transparent electrode having projections and pits cannot easily be formed though they can easily be formed in the glass substrate. If the transparent electrode also serves as an anti-reflection layer, the reflectance is usually lowered over a wide wavelength range by thinning the optical thickness (nd) of the transparent electrode to $\lambda/4$ ($\lambda$ is a wavelength which minimizes the reflectance). In the foregoing case, the transparent electrode is too thin to form projections and pits therein.

If the semiconductor layer having projections and pits for scattering light formed thereon is used, the substrate must be handled delicately. Therefore, the number of manufacturing steps increases and the manufacturing cost is increased accordingly.

As described above, the photovoltaic devices, except for those having a structure in which light is incident on the semiconductor layer from the glass substrate, encounter a problem in that the structure for scattering light on the surface of the light incident side cannot easily be employed due to limitations needed to maintain manufacturing efficiency and to reduce cost.

However, there has been a desire to improve the photoelectric conversion efficiency of photovoltaic devices which use a low-cost substrate such as a stainless steel substrate or a synthetic resin film, except for glass substrates, in order to practically manufacture a low-cost photovoltaic device which can be adapted to wide use typified by electric power generation. Therefore, there has been a desire to form the structure for scattering light on the surface of the light incident side of the photovoltaic device using a low-cost substrate beside glass substrates.

SUMMARY OF THE INVENTION

Accordingly, an object if the present invention is to provide a photovoltaic device which has a structure for scattering light on the surface of the light incident side thereof, which is not easily damaged by scratching, which can be used outdoors, the weight of which can be reduced, and which exhibits stable performance.

A photovoltaic device according to the present invention comprises at least a semiconductor layer, electrodes, and a surface protection layer adjacent to the light incident side, wherein granules of a material different from those of the surface protection layer are uniformly disposed in the surface protection layer, or the granules are dispersed sparsely adjacent to the light incident side of the surface protection layer and densely in the inner portion of the surface protection layer, or the granules are dispersed densely adjacent to the light incident side of the surface protection layer and sparsely in the inner portion of the surface protection layer.

Furthermore, the arrangement is characterized in that the granules are disposed to form one layer or a plurality of layers in the surface protection layer.

The granules may be of two or more types depending upon the material.

In order to improve the effect of light trapping due to the scattering of light, it is necessary for the difference between the refractive index of the material of the granules and that of the material of the surface protection layer to be 0.1 or more. It is preferable that the refraction index of the surface protection layer increases adjacent to the granules.

The photovoltaic device according to the present invention is characterized by a light reflection layer formed opposite the surface of the semiconductor layer on which light is incident, the light reflection layer having a structure for scattering light.

Other and further objects, features, and advantages of the invention will be appear more fully from the following description.

DETAILED DESCRIPTION OF THE PREFERRED EMBODIMENT

The structure of a photovoltaic device according to the present invention will now be described with reference to the drawings.

Figure 1:
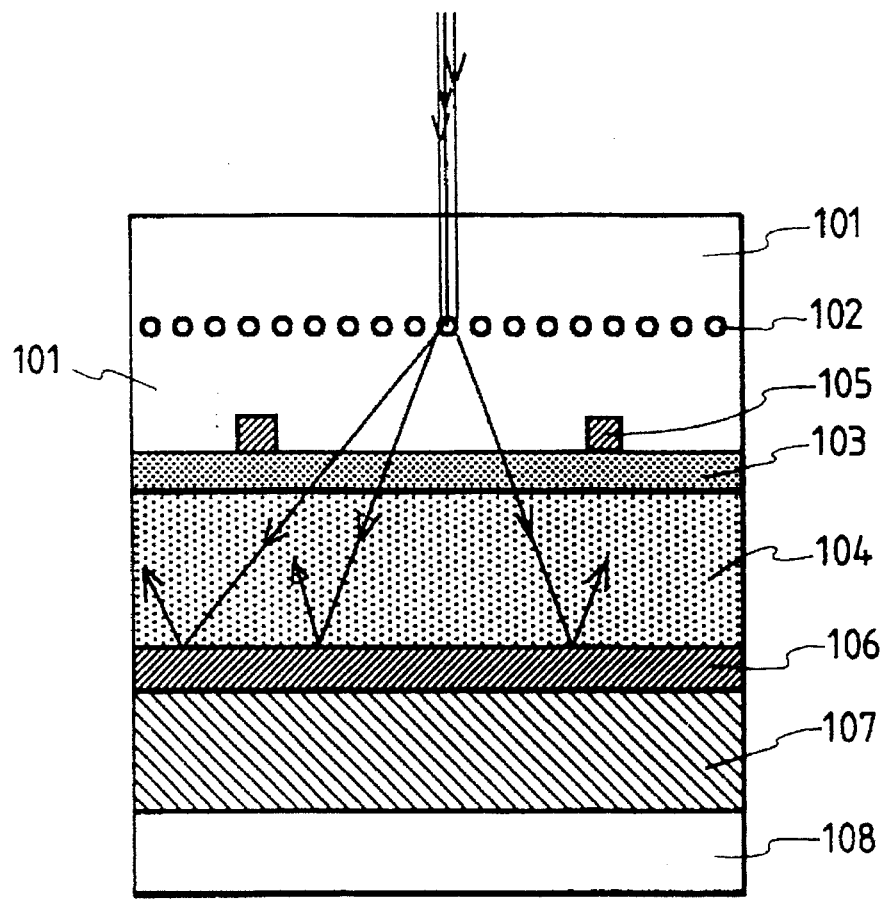
FIG. 1 is a schematic view which illustrates a photovoltaic apparatus according to the present invention.

FIG. 1 is a cross-sectional view which illustrates an example of the structure of a photovoltaic device according to the present invention. Referring to FIG. 1, reference numeral 101 represents a surface protection layer, 102 represents granules, 103 represents a transparent electrode, 104 represents a semiconductor layer, 105 represents a front electrode, 106 represents a back electrode, 107 represents a substrate, and 108 represents a back-side protection layer.

Surface Protection Layer

The surface protection layer 101 according to the present invention is formed on the surface of the photovoltaic device to protect it from the external environment, the surface protection layer 101 being made of a material exhibiting weather resistance and selected from photosynthetic resins. It is preferable that the transmittance of the surface protection material for light having wavelengths that can be absorbed by the photovoltaic device is 80% or more, more preferably 90% or more on average, most preferably 95% or more on average. Furthermore, it is preferable that the transmittance of the protection material not deteriorate excessively even if the material is allowed to stand outdoors for a long time.

It is preferable that the surface protection layer according to the present invention is formed by applying liquid resin containing granules. As an alternative to this, a method may be employed in which a resin containing granules is formed into a film, followed by adhering the film to the photovoltaic element by an adhesive agent. Specifically, any one of the following methods may be employed: a screen method, a dipping method, a rolling method, a spraying method, and a dyeing method.

In order to cause the granules to be easily dispersed in or mixed with the surface protection layer, it is most preferable that the material of the surface protection layer according to the present invention is a material which is melted when heated and which is exemplified by: silicone resin, PVB (polyvinyl butyral), fluororesin coating, acrylic resin, acrylic silicone resin, and inorganic glass coating material. As an alternative to this, a material which can be dissolved by a solvent in order to be applied to the photovoltaic element may be employed.

By rapidly cooling the molten material of the surface protection layer or by rapidly drying the solvent for the material of the surface protection layer dissolved therein, the refractive index of the surface protection layer adjacent to the granules can be increased. The reason for this is that stress acts on the surface protection layer adjacent to the granules.

The surface protection layer 101 may be formed such that it is divided into an upper transparent member, a filler, and an adhesive agent, depending upon the functions. As for a preferred material to form the upper transparent member, any one of the following materials may be employed: a fluororesin such as glass, acrylic, polycarbonate, FRP, and PVF (polyvinyl fluoride) and the like; or a silicone resin or the like. It is preferable that the filler is made of, for example, a silicone resin, PVB (polyvinyl butyral), and EVA (ethylene vinyl acetate), and the like.

In order to protect the photovoltaic device from scratch type damage, it is preferable that the thickness of the surface protection layer is 0.5 µm or more, more preferably 1 µm or more. In a case where the photovoltaic device according to the present invention is incorporated in a solar cell module used as an noncombustible exterior facing material for a building, and in order to maintain resistance against cracks, it is preferable that the thickness of the surface protection layer is 400 µm or less, more preferable 300 µm or less.

The surface protection layer may also contain an ultraviolet light absorber in order to prevent deterioration due to ultraviolet light and may contain a primer for the purpose of improving adhesion.

Granules

The granules 102 are present in the form of a layer in the surface protection layer or dispersed therein.

The granules 102 can be uniformly dispersed in the surface protection layer by mixing the granules in the molten surface protection layer before applying the surface protection layer.

If the granules 102 are disposed in the surface protection layer while it is being formed into a layer, the surface protection layer is first formed, and then the granules 102 are allowed to adhere to the surface of the surface protection layer, followed by forming a second surface protection layer. If the foregoing process is repeated several times, a plurality of granule layers can be formed in the surface protection layer.

If the distribution density of the granules is varied in the surface protection layer, two or more surface protection layers, which are different from each other in the density at which the granules are contained therein, are formed by application. As an alternative to this, the variation can be realized by dispersing the granules in the surface of the molten surface protection layers, followed by sedimentation of the granules.

If a plurality of granule layers are formed in the surface protection layer, or if two or more different types of surface protection layers containing granules are applied, the granule material may be different, depending upon the layers.

It is preferable that the average diameter of the granules is 0.001 µm to 20 µm, more preferably 0.005 µm to 10 µm. If the light scattering is to be enhanced, it is preferable that the average size of the granules is 0.3 µm to 5 µm.

If the granule layer is formed in the surface protection layer, the density of the granules in the surface protection layer is assumed to be the surface density. In this case, it is preferable that the value "S" is 0.2 to 0.9, more preferably 0.4 to 0.9, the value "S" being the ratio at which the light incident surface of the photovoltaic device is covered with granules when the granules dispersed in the layer form are viewed from the light incident direction. If the surface density of the granules in the surface protection layer is too low, sufficient scattering of light due to the granules cannot take place. If the surface density is higher than 0.9, the adhesion of the surface protection layer on the granules formed in the layer deteriorates.

If the granules are uniformly dispersed in the surface protection layer or are dispersed at different densities, it is preferable that the density per volume, that is, the volume V of the granules in the surface protection layer is 0.001 to 0.5, more preferably 0.01 to 0.3. If the density of the granules in the surface protection layer is too low, sufficient scattering of light due to the granules cannot take place. If the density is too high, the total transmittance of the surface protection layer deteriorates.

The granules 102 may be disposed at any position in the surface protection layer 101, from a position adjacent to the light incident surface to a position adjacent to the electrode 103.

In order to improve the effect of trapping incident light by scattering the same, it is preferable that the refractive factor of the granules 102 is different by 0.1 or more from the refractive index of the surface protection layer 101, more preferably 0.2 or more, most preferably 0.3 or more. It is preferable that the material of the granules 102 exhibits an average transmittance of 80% for light having a wavelength of 400 nm to 1000 nm, more preferably 90% or more on average, most preferably 95% or more on average.

Since the foregoing materials preferably employed to form the surface protection layer 101 usually have a refractive index of about 1.5 or more, it is preferable that the material of the granules 102 exhibits a refractive index of about 1.0 to 3.0, more preferably 1.2 to 2.5. Since the materials that have the refractive factors in the foregoing range usually are transmissive of light having a wavelength from 400 nm to 1000 nm, the foregoing materials can preferably be used from this viewpoint. Since materials that exhibit a refractive index of 2.5 cannot provide the foregoing light transmittance in the wavelength range from 400 nm to 1000 nm, such materials must be omitted from the group to be selected.

Furthermore, it is preferable that the material of the granules 102 exhibits excellent adhesion with the material of the surface protection layer 101, excellent chemical stability, and a thermal expansion coefficient approximating that of the material of the surface protection layer 101.

Specifically, the granules 102 are preferably made of a material selected from a group consisting of: ZnS, $TiO_2$, $Ta_2O_5$, $CeO_2$, $ZrO_2$, $Sb_2O_3$, $Nd_2O_3$, $In_2O_3$, SiC, $Si_3N_4$, SiO, $La_2O_3$, $SnO_2$, ZnO, CdO, $Cd_2SnO_4$, $ThO_2$, MgO, $Al_2O_3$, CaO, BaO, $Y_2O_3$, $Eu_2O_3$, $Pr_2O_3$, $Gd_2O_3$, $Tb_2O$, $Pr_6O_{11}$, $Dy_2O_3$, $Yb_2O_3$, $Er_2O_3$, $HO_2O_3$, $CeF_3$, $PbF_2$, $NdF_3$, $LaF_2$, $MgF_2$, LiF, $Na_3$, $AlF_6$, NaF, $CaF_2$, and the like or mixtures thereof.

If any one of the aforesaid materials is combined with a material for the surface protection layer selected from the group consisting of, for example, a silicon resin, PVB (polyvinyl butyral), and EVA (ethylene vinyl acetate), excellent adhesion and chemical stability can be attained, resulting in a preferred effect.

Methods for forming the granules 102 are exemplified by: a gas phase reaction method such as an electric furnace method, a chemical flame method, a plasma method, and a laser method; an evaporation and condensation method such as a resistance heating method, a plasma heating method, an RF induction heating method, an electron beam heating method, a laser beam heating method, and a sputtering method; a precipitation method such as a co-precipitation method, a hydrolysis method, a homogenous precipitation method, an oxidation hydrolysis method, and a deoxidation method; a solvent evaporation method such as a freeze drying method, a spray drying method, a spray heat decomposition method; and an atomizing method. In particular, it is preferable that the gas phase reaction method or the evaporation and condensation method is employed.

The shape of the granules may be spherical, columnar, square columnar, plate, or indeterminate form. In particular, granules of square columnar shape, plate shape, or indeterminate form cause light to be scattered satisfactorily.

The granules may be crystalline granules or clusters composed of a plurality of crystalline granules. In particular, satisfactory scattering of light can be attained from clusters.

The density per volume of the granules to be dispersed in the surface protection layer can be varied by a method in which prepared surface protection layers having different densities per volume are stacked; or a method in which the surface protection layer containing the granules is applied to the surface of the photovoltaic device, then a potential is generated in the surface of the photovoltaic device by biasing the surface protection layer or by irradiating the same with light while melting or maintaining the dissolved state of the surface protection layer, and then the potential is changed with time.

Transparent Electrode

The transparent electrode 103 according to the present invention serves as a light incident side electrode through which light is transmitted and also serves as an anti-reflection film by optimizing the thickness thereof. The transparent electrode 103 must have a high transmittance in a wavelength region which can be absorbed by the semiconductor layer and a low resistivity. It is preferable that the transmittance at 550 nm is 80% or higher, more preferably 85%. It is preferable that the resistivity is $5 \times 10^{-3}$ $\Omega$cm or lower, more preferably $1 \times 10^{-3}$ $\Omega$cm or lower. The material may be a conductive oxide such as $In_2O_3$, $SnO_2$, ITO ($In_2O_3 + SnO_2$), ZnO, CdO, $Cd_2SnO_4$, $TiO_2$, $Ta_2O_5$, $Bi_2O_3$, $Na_2WO_3$, and the like or conductivity may be added to the foregoing compounds.

As the element (dopant) for changing the conductivity, any one of the following elements may be employed if the transparent electrode 103 is made of ZnO: Al, In, B, Ga, Si, F, or the like. If the transparent electrode 103 is made of $In_2O_3$, Sn, F, Te, Ti, Sb, Pb, or the like is employed. If the transparent electrode 103 is made of $Sn_2O_2$, F, Sb, P, As, In, Tl, Te, W, Cl, Br, I, or the like is employed.

The method of forming the transparent electrode 103 may be an evaporation method, a CVD method, a spray method, a spin-on method, a dip method or the like.

Semiconductor Layer

The semiconductor layer 104 according to the present invention is made of any one of materials categorized as crystalline material, polycrystalline material, amorphous material, and mixtures thereof, the material being formed into a thin film or in bulk. The material of the semiconductor layer 104 may be: an element in group IV such as Si, C, Ge, and the like; an alloy in group IV such as SiGe, SiC, SiSn, and the like; a group III–V binary compound such as GaAs, InSb, GaP, GaSb, InP, InAs, and the like; a group II–VI binary compound such as ZnSe, CdTe, ZnS, AnTe, CdS, CdSe, CdTe, and the like; or a group I–III–VI multinary compound such as $CuInSe_2$; or their mixtures.

Among the foregoing semiconductor materials, any one of the following semiconductor materials may be adapted to the photovoltaic device according to the present invention; an elemental group IV semiconductor and an alloy type amorphous semiconductor of group IV such as a-Si:H (amorphous silicon hydride), a-Si:F, a-SI:H:F, a-SiGe:H, a-SiGe:F, a-SiGe:H:F, a-SiC:H, a-SiC:F, a-SiC:H:F, and the like; and a so-called polycrystalline elemental semiconductor material of group IV or an alloy-type polycrystalline semiconductor material of group IV such as polycrystalline Si, polycrystalline Si:H, polycrystalline Si:H:F, and the like. The effect of enhancing the light absorption in the semiconductor layer is improved by the light distribution of the granules according to the present invention due to the light enhancing effect if the semiconductor layer is a thin film having a thickness of 2.0 μm or less because the preferred thickness of a semiconductor layer made of an element in group IV and an alloy-type amorphous semiconductor material in group IV is from 0.1 μm to 50 μm.

At least a portion of the semiconductor layer 104 is doped to p-type and/or n-type by controlling valence electrons so that one or more pairs of pn junctions or pin junctions are formed. That is, a so-called tandem stacked cell structure may be formed by stacking a plurality of pn junction layers or pin junction layers.

The semiconductor layer 104 may be formed by any one of the following methods: a CVD method exemplified by a microwave plasma CVD method, an RF plasma CVD method, a photo CVD method, a thermal CVD method, and a MOCVD method; an evaporation method exemplified by an EB evaporation method, an MBE method, an ion plating method, and an ion beam method; a sputtering method; a spraying method; and a printing method.

Semiconductor layers employing an element in group IV and the alloy-type semiconductor amorphous semiconductor material of group IV adaptable to the photovoltaic device according to the present invention will now be described further in detail. (1) i-type layer (intrinsic semiconductor layer)

The i-type layer for use in the pin junction in the photovoltaic device which uses a group IV elemental semiconductor and the group IV amorphous semiconductor material is an important layer for generating and transporting charge carriers when irradiated with light. The i-type layer may be slightly p-type or slightly n-type.

The group IV elemental semiconductor and the alloy-type group IV amorphous semiconductor material contain hydrogen atoms (H,D) or halogen atoms (X) as indicated above, the hydrogen atoms (H,D) or halogen atoms (X) serving an important role.

Hydrogen atoms (H,D) or halogen atoms (X) contained in the i-type layer act to compensate the dangling bonds in the i-type layer and improve the product of the mobility of the charge carrier and its lifetime in the i-type layer. Furthermore, hydrogen atoms (H,D) or halogen atoms (X) act to compensate the interfacial level between the p-type layer and the i-type layer and between the n-type layer and the i-type layer to enlarge the photovoltaic force and the photoelectric currents of the photovoltaic device and to improve the optical response. It is preferable that the quantity of hydrogen atoms and/or halogen atoms contained in the i-type layer is from 1 to 40 atm %. In particular, it is preferable that a large quantity of hydrogen atoms and/or halogen atoms is distributed adjacent to the interfaces between the p-type layer and the i-type layer and between the n-type layer and the i-type layer. It is preferable that the content of hydrogen atoms and/or halogen atoms adjacent to the foregoing interfaces is 1.1 to 2 times the content of those in the bulk. Furthermore, it is preferable that the content of hydrogen atoms and/or halogen atoms is varied with respect to the content of silicon atoms.

The thickness of the i-type layer considerably depends upon the structure (for example, single cell, double cell, or triple cell) of the photovoltaic device and depends upon the band gap of the i-type layer. However, it is preferable that the thickness is from 0.05 to 1.0 μm.

More specifically, amorphous silicon (a-Si:H) for the i-type layer adaptable to the photovoltaic device according to the present invention is characterized as follows: optical band gap (Eg) is 1.60 eV to 1.85 eV; content (CH) of hydrogen atoms is 1.0 to 25.0%; light conductibity ($\delta$H) under pseudo solar light of AM 1.5 and 100 mW/cm$^2$ is $1.0 \times 10^{-5}$ S/cm or more; dark conductivity ($\delta$d) is $1.0 \times 10^{-9}$ S/cm or less; the inclination of the Urbach tail in a constant photo-method (CPM) is 55 meV or less; and the density of the dangling bonds in electron spin resonance (ESR) is $10^{17}$/cm$^3$ or less.

I-type amorphous silicon germanium adaptable to the photovoltaic device according to the present invention is characterized follows: optical band gap (Eg) is 1.35 eV to 1.70 eV; content (CH) of hydrogen atoms is 1.0 to 20.0%; light conductivity ($\delta$p) under pseudo solar light of AM 1.5 and 100 mW/cm$^2$ is $1.0 \times 10^{-7}$ S/cm or more; dark conductivity ($\delta$d) is $1.0 \times 10^{-8}$ S/cm or less; the inclination of the Urbach tail in a constant photo-method (CPM) is 60 meV or less; and the density of the dangling bonds in electron spin resonance (ESR) is $10^{17}$/cm$^3$ or less.

By using the group IV elemental semiconductors and the alloy type group IV amorphous semiconductor materials, the transport characteristics of the optically generated charge carriers can be improved. As a result, the sensitivity of long wavelength light can be improved, and the effect of enhancing the light absorption in the semiconductor layer due to the scattering of light due to the granules according to the present invention can be improved due to a synergistic effect. Therefore, the characteristics of the photovoltaic device can be further improved. The reason for this is, if attainment of the foregoing characteristics reduces the so-called density of localized states in the semiconductor layer and the length of the optical path of light scattered by the granules is lengthened, the optically generated charge carriers are not recombined but are effectively collected to enhance the effect of improving the sensitivity of the photovoltaic device for long wavelength light.

(2) p-Type Layer or n-Type Layer

The amorphous semiconductor material (hereinafter expressed as "a-") or microcrystalline semiconductor for the p-type layer or the n-type layer (hereinafter expressed as "μc-") is exemplified by a material composed of any one of the following materials: a-Si:H, a-Si:HX, a-SiC:H, a-SiC:E, a-SiGe:H, a-SiGeC:H, a-SiO:H, a-SiN:H, a-SiON:E, a-SiOCN:HX, μc-Si:H, μcSiC:H, μc-Si:HX, μc-SiC:HX, μc-SiGe:H, μc-SiO:H. μcSiGeC:H, μc-SiN:H, μc-SiON:HX, or μc-SiOCN:HX; and a p-type valence electron control agent (B, Al, Ga, In, or Tl of group III of the periodic table) or an n-type valence electron control agent (P, As, Sb or Bi of group V of the periodic table) is added to any of the foregoing materials at a high concentration. The polycrystalline material is exemplified by any one of the following materials: poly-Si:H, poly-Si:HX, poly-SiC:H, poly-SiC:HX, poly-SiGe:H, poly-Si, poly-SiC, or poly-SiGe; and a p-type valence electron control agent (B, Al, Ga, In or Tl of group III of the periodic table) or an n-type valence electron control agent (P, As, Sb or Bi of the periodic table) is added to any one of the foregoing materials at a high concentration.

In particular, it is preferable that the p-type layer or the n-type layer on the light incident side is made of crystalline semiconductor layer which does not absorb light considerably, or is made of an amorphous semiconductor layer having a wide band gap.

The optimum quantity of the group III element of the periodic table added to the p-type layer and that of the group V element added to the n-type layer is from 1 to 50 atm %.

Hydrogen atoms (H, D) or halogen atoms (X) contained in the p-type layer on the n-type layer compensate dangling bonds in the p-type layer or the n-type layer to improve the doping efficiency of the p-type layer or the n-type layer. The optimum quantity of hydrogen atoms or halogen atoms added to the p-type layer or the n-type layer is from 0.1 to 40 atm %. In particular, if the p-type layer on the n-type layer is a crystalline layer, the optimum quantity of hydrogen atoms or halogen atoms is from 0.1 to 8 atm %. Furthermore, it is preferable that a large quantity of hydrogen atoms and/or halogen atoms is distributed adjacent to the interfaces between the p-type layer and the i-type layer and between the n-type layer and the i-type layer. It is preferable that the content of hydrogen atoms and/or halogen atoms adjacent to the foregoing interfaces is 1.1 to 2 times the content in the bulk. By enlarging the content of hydrogen atoms or halogen atoms adjacent to the interfaces between the p-type layer and the i-type layer and between the n-type layer and the i-type layer as described above, defective levels and mechanical strain can be reduced. As a result, the photovoltaic force and the photoelectric current of the photovoltaic device according to the present invention can be enlarged.

As for the electric characteristics of the p-type layer and the n-type layer of the photovoltaic device, it is preferable that the activation energy is 0.2 eV or less, more preferably 0.1 eV or less. It is preferable that the specific resistance is 100 Ωcm or less, more preferably 1 Ωm or less. Furthermore, it is preferable that the thickness of the p-type layer and that of the n-type layer is from 1 to 50 nm, more preferably 3 to 10 nm.

The optimum method of manufacturing the semiconductor layer of the photovoltaic device according to the present invention and made of the Group IV elemental semiconductor and the alloy-type Group IV amorphous semiconductor material is a microwave plasma CVD method, and a secondarily preferable method is an RF plasma CVD method.

The microwave plasma CVD method comprises the steps of: introducing gases such as a raw material gas and a dilution gas into a deposition chamber (a vacuum chamber) lowering the internal pressure in the deposition chamber while exhausting the deposition chamber by using a vacuum pump; and introducing microwaves generated by a microwave power source into the deposition chamber through a wave guide pipe and a dielectric window (made of alumina ceramics or the like) to cause plasma of the raw material gas to be generated to decompose the raw material gases. As a result, a desired deposition film is formed on a substrate disposed in the deposition chamber. With the foregoing method, a deposited film adaptable to the photovoltaic device and producible under wide deposition conditions can be formed.

If the semiconductor layer of the photovoltaic device according to the present invention is deposited by the microwave plasma CVD method, the preferred deposition conditions are as follows: the temperature of the substrate in the deposition chamber is from 100° to 450° C., the internal pressure is from 0.5 to 30 mTorr, the power of the microwaves is 0.01 to 1 W/cm$^2$, and the frequency of the microwaves is from 0.5 to 10 GHz.

If the semiconductor layer is deposited by the RF plasma CVD method, the preferred deposition conditions are as follows: the temperature of the substrate in the deposition chamber is from 100° to 350° C., the internal pressure is from 0.1 to 10 Torr, the power of the RF waves is 0.01 to 5.0 W/cm$^2$, and the deposition speed is 0.1 to 30 A/sec.

The raw material gas used to deposit the Group IV elemental semiconductor or the alloy type Group IV amorphous semiconductor layer for the photovoltaic device according to the present invention is exemplified by a compound which contains silicon atoms and which can be gasified, a compound which contains germanium atoms and which can be gasified, a compound which contains nitrogen atoms and which can be gasified, and a compound which contains oxygen atoms and which can be gasified, and mixtures thereof.

Compounds which contain silicon atoms and which can be gasified are exemplified by $SiH_4$, $Si_2H_6$, $SiF_4$, $SiFH_3$, $SiF_2H_2$, $SiF_3H$, $Si_3H_3$, $SiD_4$, $SiHD_3$, $SiH_2D_2$, $SiH_3D$, $SiFD_3$, $SiF_2D_2$, $SiD_3H$, and $Si_2D_3H_3$.

Compounds which contain germanium atoms and which can be gasified are exemplified by $GeH_4$, $GeD_4$, $GeF_4$, $GeFH_3$, $GeFH_3$, $GeF_2H_2$, $GeF_3H$, $GeED_3$, $GeH_2D_2$, $GeH_3D$, $Ge_2H_6$, and $Ge_2D_6$.

Compounds which contain carbon atoms and which can be gasified are exemplified by $CH_4$, $CD_4$, $C_nH_{2n+2}$ (n is an integer), $C_nH_{2n}$ (n is an integer), $C_2H_2$, $C_6H_6$, $CO_2$, and CO.

Compounds which contain nitrogen atoms and which can be gasified are exemplified by $N_2$, $NH_3$, $ND_3$, NO, $NO_2$, and $N_2O$.

Compounds which contain oxygen atoms and which can be gasified are exemplified by $O_2$, CO, $CO_2$, NO, $NO_2$, $N_2O$, $CH_3CH_2OH$, and $CH_3OH$.

The materials to be introduced into the p-type layer or the n-type layer to control the valence electrons are exemplified by atoms in groups III and V of the periodic table.

As for effective starting materials for introducing atoms of group III, starting materials for introducing boron atoms are exemplified by boron hydrides such as $B_2H_6$, $B_4H_{10}$, $B_5H_9$, $B_5H_{11}$, $B_6H_{10}$, $B_6H_{12}$ and $B_6H_{14}$, and boron halides such as $BF_3$ and $BCl_3$. Furthermore, $AlCl_3$, $GaCl_3$, $InCl_3$, and $TiCl_3$ are exemplified. In particular, it is preferred to employ $B_2H_6$ or $BF_3$.

As for effective starting materials for introducing atoms of group V, starting materials for introducing phosphorus atoms are exemplified by phosphorus hydrides such as $PH_3$ and $P_2H_4$, and phosphorus halides such as $PH_4I$, $PF_3$, $PF_5$, $PCl_3$, $PCl_5$, $PBr_3$, $PBr_5$, and $PI_3$. Furthermore, any one of the following materials may be employed: $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$. It is preferable that $PH_3$ or $PF_3$ is employed.

The foregoing compounds which can be gasified may be diluted by $H_2$, He, Ne, Ar, Xe or Kr gas, followed by introduction into the deposition chamber.

If a microcrystalline semiconductor or a-SiC:H which does not considerably absorb light or has a wide band gap is deposited, it is preferable that the raw material gas is diluted with a hydrogen gas by 2 to 100 times, and a relatively large microwave power or RF power is introduced.

Front Electrode

The front electrode 105 according to the present invention is formed on a portion of the transparent electrode 103 if the resistivity of the transparent electrode 103 cannot be lowered sufficiently. The front electrode 105 reduces the series resistance of the photovoltaic device by lowering the resistivity of the electrode. The material of the front electrode 105 is exemplified by metal such as gold, silver, copper, aluminum, nickel, iron, chrome, molybdenum, tungsten, titanium, cobalt, tantalum, niobium, zirconium, or an alloy such as stainless steel, or a conductive paste containing granular metal.

Figure 4:
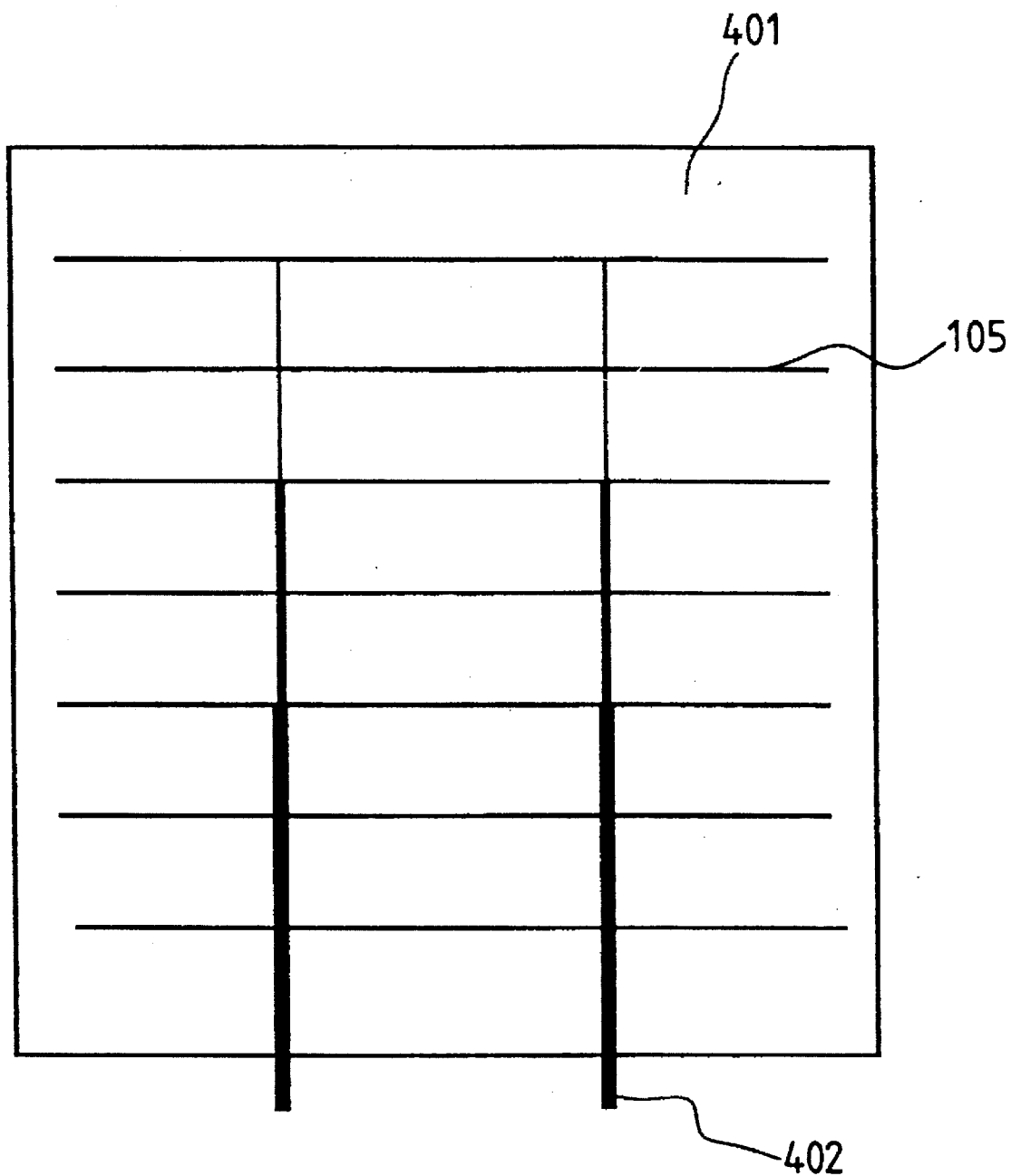
FIG. 4 is a schematic plan view which illustrates an example of a photovoltaic device according to the present invention.

The front electrode 105 is formed into, for example, a grid-like shape as shown in FIG. 4 in order not to shield light incident on the semiconductor layer.

It is preferable that the area of the front electrode is 15% or less of the area of the photovoltaic device, more preferably 10% or less, most preferably 5% or less.

The method of forming the front electrode is exemplified by: a sputtering method which employs a patterned mask; a resistance heating method; a CVD evaporation method; a method comprising the steps of evaporating a metal layer on the entire surface and patterning by etching the metal layer; a method in which the grid electrode pattern is directly formed by the photo CVD method; a method comprising the steps of forming a negative pattern mask of the electrode pattern followed by forming the front electrode by plating; and a method of forming the same by printing of conductive paste. The conductive paste is prepared by, for example, dispersing granular metal in a polymer binder. The polymer binder is exemplified by a polyester resin, epoxy resin, acrylic resin, alkyd resin, polyvinyl acetate resin, rubber, urethane, and phenol resin.

Back Electrode and Light Reflective Layer

The back electrode 106 according to the present invention is an electrode disposed on the back side of the semiconductor layer with respect to the direction of light incidence. The back side electrode 106 is made of any one of the following materials: gold, silver, copper, aluminum, nickel, iron, chrome, molybdenum, tungsten, titanium, cobalt, tantalum, niobium, zirconium, or an alloy such as stainless steel. It is preferable that metal such as aluminum, copper, silver, or gold having high reflectivity is employed. If a metal having high reflectivity is employed, the back electrode is able to also serve as a light reflective layer which reflects light which has not been absorbed by the semiconductor layer, back to the semiconductor layer.

Although the back electrode may be flat, it is preferable that the back electrode is formed into a shape having projections and pits capable of scattering light. The projections and pits capable of scattering long wavelength light, which cannot be absorbed by the semiconductor layer, cause the optical path to be lengthened. As a result, the sensitivity of the photovoltaic device to long wavelength light is improved, causing the short-circuit current to be increased. Therefore, the efficiency of the photoelectric conversion can be improved. It is preferable that the projections and pits for scattering light be such that the difference Rmax between the top and the bottom of the projections and the pits is in the range from 0.2 μm to 2.0 μm.

However, the necessity of forming the back electrode can be sometimes eliminated if the substrate also serves as the back electrode.

27 The back electrode can be formed by an evaporation method, a sputtering method, a plating method, and a printing method. The back electrode can be formed into the shape having projections and pits capable of scattering light by dry etching, wet etching, sand blasting, or heating the formed metal or alloy film. The shape having projections and pits capable of scattering light can be formed by evaporating the foregoing metal or alloy while heating the substrate.

Substrate

The material of the substrate 107 according to the present invention may either be conductive or insulating. The conductive material may be molybdenum, tungsten, titanium, cobalt, chrome, nickel, copper, tantalum, niobium, zirconium, or aluminum, and their alloys formed into a plate or a film. In order to improve corrosion resistance, it is preferable that stainless steel, nickel chrome alloy, and single metals and/or alloys of nickel, tantalum, niobium, zirconium, and titanium be employed. Another arrangement wherein a conductive layer is formed on an insulating material may be employed.

The insulating material may be a synthetic resin film or sheet made of polyester, polyethylene, polycarbonate, cellulose acetate, polypropylene, polyvinyl chloride, polyvinylidene chloride, polystyrene, or polyamide; or a plate-like inorganic insulating material such as glass, ceramics, or quartz. A material manufactured by coating an insulating material on a conductive material may be employed.

If a crystalline semiconductor layer is employed, the necessity of forming the substrate 107 can sometimes be omitted by using the crystalline semiconductor as the substrate.

Back Side Protection Layer

The back side protection layer 108 is provided to protect the back side of the photovoltaic device, and is made of a material having weather resistance and is selected from synthetic resins.

The back side protection layer 108 can be formed by bonding the foregoing material in the form of a film to the photovoltaic device after the film material has been deaerated, or by applying, to the photovoltaic device, the material melted with heat or dissolved in a solvent.

A method of manufacturing the photovoltaic device according to the present invention will now be described.

When the photovoltaic device according to the present invention is manufactured, each of the layers constituting the photovoltaic device is formed as described above. The layers are formed in the following sequential order: first, the substrate 107 is cleaned, and the back electrode 106, the semiconductor layer 104, the transparent electrode 103, and the front electrode 105 are sequentially formed. Then, an output electrode (omitted from illustration) is formed, and the surface protection layer 101 including granules 102 is formed and the back side protection layer 108 is formed.

However, the aforesaid order is sometimes altered if the substrate 107 is not used, e.g. the semiconductor layer 104 is used as the substrate.

Furthermore, if photovoltaic devices are connected in series or in parallel, the support member, such as a flat plate, supports the plurality of substrates on which photovoltaic devices are formed. The substrates are attached to the support member and photovoltaic devices are connected onto the support member and, thereafter, the surface protection layers are formed. Examples of the present invention will now be described. The present invention is not limited to the descriptions made in the examples.

EXAMPLE 1

First, an amorphous silicon (hereinafter called "a-Si") photovoltaic device of the type shown in FIG. 2 was manufactured. The manufacturing process will now be described.

A laminate of Al film having a thickness of 500 nm and a ZnO film having a thickness of 500 nm were, as the back electrode 206, formed on a cleaned stainless-steel substrate 207 by a sputtering method. Then, a CVD method was employed wherein the following layers were sequentially formed as follows: an n-type a-Si layer was formed from $SiH_4$, $PH_3$, and $H_2$; an i-type a-Si layer was formed from $SiH_4$ and $H_2$; and a p-type microcrystalline μc-Si layer was formed from $SiH_4$, $BF_s$, and $H_2$. As a result, a semiconductor layer 204 was formed which included an n-layer having a thickness of 15 nm, an i-layer having a thickness of 400 nm, a player having a thickness of 10 nm, an n-layer having a thickness of 10 nm, an i-layer having a thickness of 80 nm, and a p-layer having a thickness of 15 nm.

Then, the transparent electrode 203 was formed by evaporating an $In_2O_3$ film having a thickness of 70 nm in an $O_2$ atmosphere by a resistance heating method. Then, an electric current collecting grid-shaped front electrode 205 was formed by a screen printing method using silver paste. As a result, a photovoltaic device was manufactured.

An output terminal of the photovoltaic device thus manufactured was then formed, followed by sequentially applying the following coatings, each of which has a thickness of 50 μm, to the transparent electrode layer 203 and the front electrode 205 by using a roll coater: a coating in which granules of $Al_2O_3$·MgO (MgO 0:0.05 wt %) having an average size of 0.04 μm were, at 30 wt %, dispersed in a fluororesin coating (pencil hardness in a hardened state: 5H, and refractive index: 1.52) containing Si—O polymer; and a coating in which the same was dispersed similarly at 10 wt %. Then, the photovoltaic device was heated at 160° C. for 20 minutes to harden, so that a surface protection layer containing transparent ceramic granules and having a thickness of 100 mm was formed. Consequently, a photovoltaic device covered with the coating was obtained.

The photovoltaic device thus manufactured was evaluated as follows:
(1) Scratching Test A load of 907 g was applied to a corner of a carbon steel member of a hacksaw to scratch the specimen at a speed of 152.4±30.5 m/s followed by evaluating the performance of the photovoltaic device after scratching.

(2) Ice Falling Test

An ice ball having a diameter of 25.4 nm was collided at a terminal velocity to evaluate the performance of the photovoltaic device after the collision. (3) Taper-Type Wear Resistance Test The specimen was worn under conditions in conformity with JIS K7204: abrasion ring CS-10 was used; a load of 500 g was applied; number of rotations was 100. The difference in weight caused due to the experiment was evaluated.

(4) Bending Test

The specimen was wound around a column having a diameter of 20 mm; followed by bending at an angular degree of 180° to evaluate visually the presence of cracks of the coating.

Results of the foregoing experiments will now be described.

The output did not deteriorate due to the scratching test and the ice falling test, and excellent wear resistance was confirmed in the wear resistance test because no significant difference in weight was observed. In the bending test, no separation and cracks were generated. Furthermore, the specimen was operated stably in a high humidity operation test. In addition, a transmittance of 80% or higher was observed as a result of a measurement performed with an integrating sphere type beam transmittance measuring apparatus.

EXAMPLE 2

Figure 2:
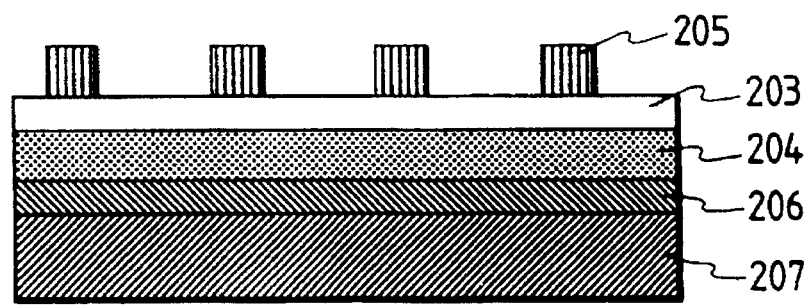
FIG. 2 is a schematic cross-sectional view which illustrates an example of a photovoltaic element for use in the photovoltaic device according to the present invention.

In this example, a photovoltaic device was made having the arrangement shown in FIG. 2 wherein the semiconductor layer was made of copper indium selenide.

The copper indium selenide photovoltaic device was manufactured as follows: the conductive substrate was made of stainless steel, and a molybdenum conductive layer was evaporated thereon by a sputtering method to a thickness of 500 nm. Then, a Cu layer having a thickness of 200 nm and an In layer having a thickness of 400 nm were sequentially formed thereon, and the substrate was then treated in a vapor of $H_2Se$ followed by a heat treatment in an atmosphere of argon gas at 400° C. Then, a ZnCdS layer having a thickness of 600 nm was deposited thereon by a sputtering method, so that a photovoltaic semiconductor layer was formed.

Then, a ZnO layer was formed thereover by a sputtering method to a thickness of 70 nm, so that a transparent conductive layer was formed. Then, a front electrode was formed thereon by screen printing using silver paste, whereby a photovoltaic device was manufactured.

Then, the transparent conductive layer and the front electrode of the photovoltaic device thus manufactured were applied with a fluororesin coating (pencil hardness in a hardened state: 2H, and refractive index: 1.4) to a thickness of 20 μm by a spraying method. Immediately after this, a coating, in which MgO.MNaF (NaF: 0.25 wt %) having an average size of 0.1 μm was, by 50 wt %, dispersed in the foregoing fluororesin coating, was applied to a thickness of 30 μm. Then, another larger of the foregoing fluororesin coating (pencil hardness in a hardened state: 2H, and refractive factor: 1.4) was applied by the spraying method to a thickness of 20 μm. Then, heat treatment at 150° C. for 15 minutes was performed, so that a surface protection layer containing ceramic granules transparent in the visible region and having a total thickness of 70 μm was formed. Consequently, a photovoltaic device with the desired surface coating was manufactured.

The photovoltaic device thus manufactured was evaluated by a method similar to Example 1, resulting as follows:

The output did not deteriorate due to the scratching test and the ice falling test. In the wear resistance test, although a slight weight difference of 2 $mg/m^2$ took place in 100 rotations or less, no significant change was observed afterwards, indicative of excellent wear resistance. In the bending test, no separation and cracks were generated. Furthermore, the specimen operated stably in a high humidity operation test. In addition, a transmittance of 80% or higher was observed as a result of a measurement performed with an integrating sphere type beam transmittance measuring apparatus.

EXAMPLE 3

The photovoltaic device according to this example had an arrangement wherein the semiconductor layer shown in FIG. 2 was made of polycrystalline silicon. First, a stainless steel substrate with a Cr coating applied by a sputtering method was provided. Then, a polycrystalline silicon film having a thickness of about 30 μm was grown thereon by a liquid layer growth method, at a speed of 0.4 μm per minute on the stainless steel in such a manner that the temperature of a solution in which Si, doped with Sn, was dissolved in Sn having a purity of 6N was lowered from 1000° C. to 900° C. at a descending rate of 2° per minute in a furnace having a hydrogen atmosphere. Then, a plasma CVD method was employed to deposit a p-type microcrystalline silicon (μc-Si) layer from $SiH_4$, $BF_3$, and $H_2$, resulting in a junction being formed. Then, ITO having a thickness of 60 nm was evaporated thereover by a resistance heating method. The front electrode was formed by screen-printing silver paste.

The transparent conductive layer and the front electrode of the photovoltaic device thus manufactured were applied with the following solution by a dipping method while masking a portion for the output terminal thereof: a solution in which water glass (pencil hardness after it had been hardened: 8H, and 9 refractive index of 1.5) and a fluororesin solution (fluorinate solution having a refractive index of 1.29) were mixed at a ratio of 1:3 and the particles of the water glass were emulsified and dispersed to have an average particle size of 1.2 μm by using a high pressure emulsifying and dispersing machine (a nanomizer system). Then, the applied coating was dried at 80° C. for three minutes. After the foregoing operation was repeated three times, the coating was hardened at 120° C. for 20 minutes. As a result, a surface protection layer containing ceramic granules transparent in the visible region and having a thickness of 60 μm was formed. Since the specific gravity (1.2) of the water glass is smaller than the specific gravity (1.7) of the fluororesin solution, the proportion of the glass granules accumulating at the surface was raised in this example. Thus, a photovoltaic device applied with the coating was manufactured.

The photovoltaic device thus manufactured was evaluated by a method similar to Example 1, resulting in:

The output did not deteriorate due to the scratching test and the ice falling test, and excellent wear resistance was confirmed in the wear resistance test because no significant difference in weight was observed. In the bending test, no separation and cracks were generated. Furthermore, the specimen operated stably in a high humidity operation test. In addition, a transmittance of 80% or higher was observed as a result of a measurement performed with an integrating sphere type beam transmittance measuring apparatus.

EXAMPLE 4

The transparent electrode and the front electrode of a photovoltaic device were applied with the following coatings in the following manner: a coating, in which 40 wt % $MgF_2$ (average particle size: 1.0 μm) was dispersed in an acrylic resin (pencil hardness after it has been hardened: 2H, and refractive index of 1.45), and a coating in which 40 wt % $ThO_2 \cdot YO_3$ ($Y_2O_3$: 5 mol%) was dispersed in the foregoing acryl resin were prepared; and then, the coatings were applied by a tandem type dye-coater to each have a thickness of 30 μm in such a manner that the coating containing $ThO_2 \cdot Y_2O_3$ was formed adjacent to the photovoltaic device. The applied coatings were hardened with ultraviolet rays, so that a surface protection layer containing ceramic granules in the visible light region and having a thickness of 60 μm was formed. Consequently, a photovoltaic device supplied with the coating was manufactured.

The photovoltaic device thus manufactured was evaluated by a method similar to Example 1, resulting in: the output did not deteriorate due to the scratching test and the ice falling test, and excellent wear resistance was confirmed in the wear resistance test because no significant difference in weight was observed. In the bending test, no separation and cracks were generated. Furthermore, the specimen operated stably in a high humidity operation test. In addition, a transmittance of 90% or higher was observed as a result of a measurement performed with an integrating sphere type beam transmittance measuring apparatus. The reason for this is that $MgF_2$ has a small refractive index of 1.39, which reduces the surface reflection.

COMPARATIVE EXAMPLE 1

An ethylene-tetrafluoroethylene copolymer film having a thickness of 25 mm and EVA having a thickness of 500 mm were used as the fluororesin film in place of the fluororesin coating according to Example 1 which contained ceramic granules transparent in the visible region. Consequently, a comparative photovoltaic device was manufactured.

The photovoltaic device thus manufactured was evaluated by a method similar to Example 1, resulting in: the output did not deteriorate due to the scratching test and the ice falling test. A weight difference of 10 mg/m² took place in the wear resistance test, resulting in unsatisfactory wear resistance. In the bending test, a local separation took place between the fluororesin film and the EVA.

COMPARATIVE EXAMPLE 2

The process according to Example 3 in which mixing, emulsification, and dispersion of the water solution of the water glass was omitted, i.e., a fluororesin coating solution not containing water glass particles was applied to the photovoltaic device. Then, the coating was heated and hardened at 80° C. for 5 minutes, so that a fluororesin layer having a thickness of 60 μm was formed. Consequently, a photovoltaic device applied with the coating was manufactured.

The photovoltaic device thus manufactured was evaluated by a method similar to Example 1, resulting in: the output did not deteriorate considerably due to the ice falling test. A deterioration in the output of 30% took place in the scratching test. A weight difference of 15 mg/m² took place in the wear resistance test, resulting in unsatisfactory wear resistance. In the bending test, a local separation took place between the fluororesin layer and the transparent electrode layer of the photovoltaic device.

As seen from the results of Examples 1 and 4 and Comparative Examples 1 and 2, the photovoltaic device according to the present invention is durable against scratching, and reveals excellent bending resistance and wear resistance.

EXAMPLE 5

Figure 3:
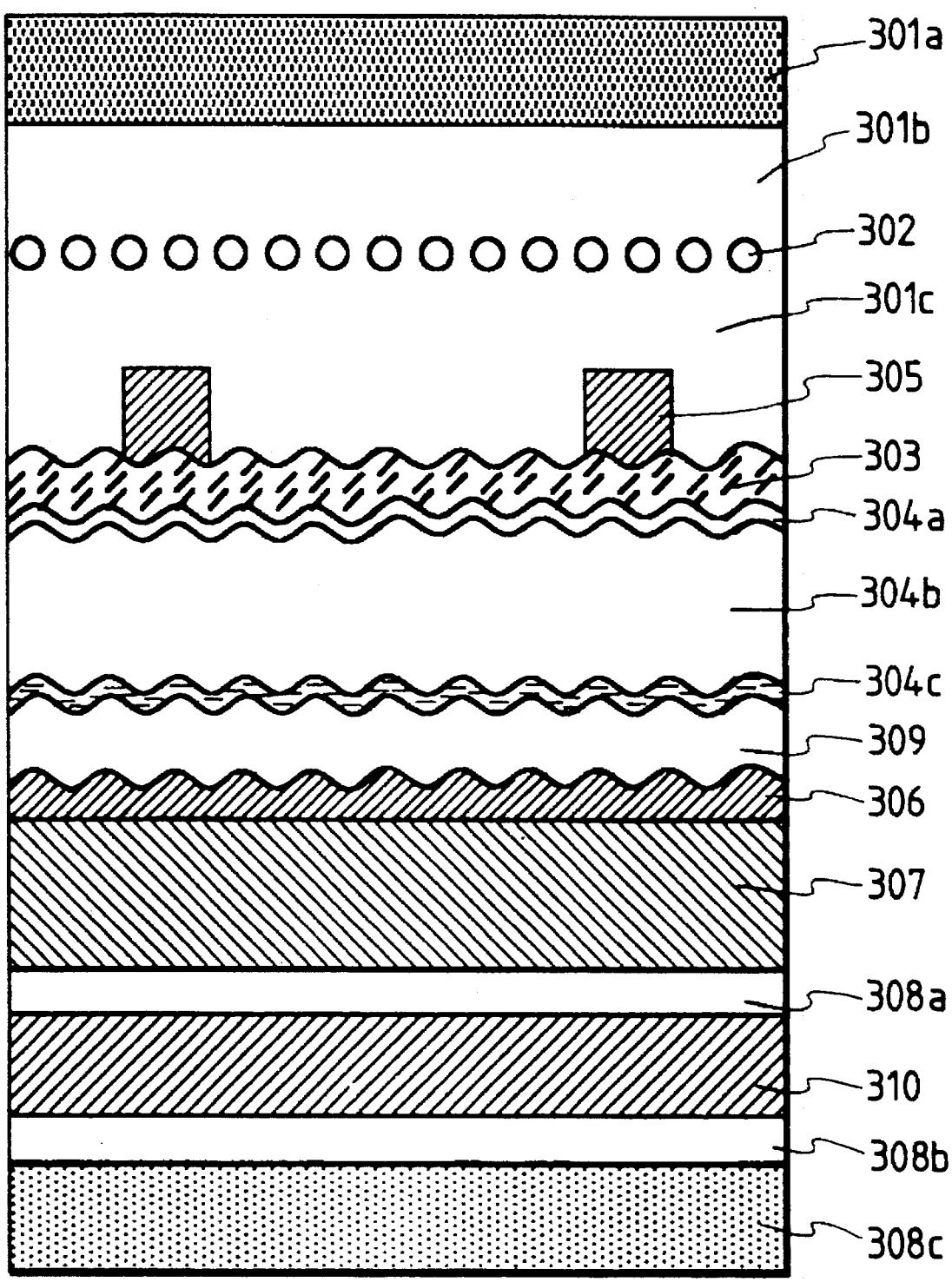
FIG. 3 is a schematic cross-sectional view which illustrates an example of a photovoltaic device according to the present invention.

FIG. 3 is a schematic cross-sectional view which illustrates another example of a photovoltaic device according to the present invention. The photovoltaic device shown in FIG. 3 has a semiconductor layer made of a-Si and amorphous silicon-germanium (hereinafter abbreviated to "a-SiGe"). In this example granules in the form of a layer are formed in the surface protection layer.

Referring to FIG. 3, reference numerals 301a, 301b, and 301c represent surface protection layers which are categorized as an upper transparent member 301a and adhesive layers 301b and 301c, depending upon the function. Reference numeral 302 represents granules, 303 represents a transparent electrode, 304a, 304b, and 304c represent semiconductor layers, 305 represents a front electrode, 306 represents a back electrode, 307 represents a substrate, 308a and 308b represent adhesive layers, and 308c represents a back side protection layer. Reference numeral 309 represents a transparent conductive layer, and 310 represents an insulating layer. This embodiment has an arrangement wherein the transparent conductive layer 309 is provided to prevent diffusion of the back electrode 306 into the semiconductor layer 304 so as to improve the manufacturing yield of the photovoltaic device, and to enhance the scattering of light by the back electrode 306.

The photovoltaic device according to this example of the invention was manufactured by the following process.

First, a stainless steel plate (SUS 304) having a surface roughness (Rmax) of 0.1 μm or less, a thickness of 0.7 mm, and a size of 10 cm×10 cm and serving as the substrate 307 was cleaned. Then, Ag serving as the back electrode 306 was formed thereon to an average thickness of 0.4 μm by an RF sputtering method. By performing sputtering while heating the substrate at 380° C., a surface contour having projections and pits capable of scattering light of 0.6 μm Rmax was formed.

Then, a zinc oxide (ZnO) transparent conductive layer 309 was formed thereon by using a DC magnetron sputtering apparatus to a thickness of 0.4 μm.

Then, the following semiconductor layers were formed by a known glow discharge (GD) method in which RF waves of 13.56 MHz were applied to the electrode to create a plasma of the raw material gas under a lowered pressure whereby the raw material gas was decomposed. First, monosilane ($SiH_4$) and phosphine ($PH_3$) diluted with $H_2$ were decomposed while heating the substrate at 300° C., so that an n-type a-Si layer 304c having a thickness of 20 nm was formed on the substrate on which the ZnO layer 309 and the other layers formed prior to forming the ZnO layer were formed. Then, monosilane ($SiH_4$) and germane ($GeH_4$) diluted with $H_2$ were decomposed while heating the substrate at 250° C., whereby an i-type a-SiGe layer 304b was formed on the n-type a-Si layer 304c to a thickness of 250 nm (evaluation of an i-type a-SiGe layer formed on a glass substrate and having a thickness of 1 mm under the same film forming conditions resulted in an optical band gap (Eg) of 1.45 eV).

The i-type a-SiGe layer 304b has buffer layers each having a thickness of 30 nm adjacent to each of the n-layer and the p-layer, the buffer layers being layers in which a-SiGe is continuously changed to a-Si.

Then, monosilane ($SiH_4$) and boron trifluoride ($BF_3$) were decomposed while heating the substrate at 200° C., whereby p-type microcrystalline silicon layer 304a was formed to a thickness of 5 nm.

Then, a resistance heating and evaporating method was employed wherein ITO was evaporated to a thickness of 70 nm while heating the substrate at 170° C., whereby the transparent electrode 303 was formed. Then, as shown in FIG. 4, an electron beam evaporation method was employed to evaporate Al on the transparent electrode 401 (=303) in a pattern while using a mask, so that the front electrode portions 105, 402 (=305) were formed.

Then, output electrodes (not shown) were formed at end portions of the back electrode and the front electrode.

Then, EVA (ethylene vinyl acetate) was melted at 80° C. and applied to the surface of the photovoltaic device in which the output electrodes and the layers to be formed prior to forming the output electrodes were formed, the EVA being applied to a thickness of 100 µm. As a result, the surface protection layer 301c was formed.

By employing a gas phase reaction method in which zinc vapor is oxidized, granules 302 made of ZnO were formed. The formed granules 302 were sprayed on the surface protection layer 301c to form a layer. The gas phase reaction conditions were changed at this time, so that granules having different particle sizes were formed. As a result, photovoltaic devices including granules having different particle sizes were formed. Granules having a particle size larger than 1 µm were formed by oxidizing zinc granules or by crushing ZnO crystals. Furthermore, photovoltaic devices were formed in which the density of spraying the granules having an average particle size of 0.5 µm was varied.

Then, a PVF film serving as the upper transparent member 301a and having a thickness of 40 µm was bonded to the surface of the granules 302 with an EVA film 301b (having a refractive index of 1.5) having a thickness of 100 µm. As a result, the granules 302 were formed in the surface protection layer.

Then, a nylon film having a thickness of 50 µm and serving as the insulating layer 310 and a PVF film having a thickness of 40 µm and serving as the back side protection layer 308c were bonded to the back side of the substrate 307 with interposed EVA films 308a and 308b. Then, heating at 150° C. for one hour was performed to harden the EVA which forms the adhesive layers. As a result, a photovoltaic device as shown in FIG. 3 was manufactured. As a result, a so-called single-layer type a-SiGe photovoltaic device of 10 cm×10 cm was manufactured.

Then, the average of the characteristics of the photovoltaic device having a parallel resistance of 1 KΩ or more per 1 cm² such as the open circuit voltage (Voc), the short-circuit current (Jsc), the fill factor (FF), and the photoelectric conversion efficiency (η) were measured by using a solar simulator at 25° C. which provided a pseudo solar light of AM 1.5 and 100 mW/cm².

Here, 11 types of samples were made having average particle sizes of ZnO (refractive index 2.0) forming the layer 302 in the surface protection layer 301 varying from 0.07 µm to 56 µm. At this time, the surface density S of the granules forming the layer 302 was made set at a substantially uniform value of 0.8.

The characteristics of each of the above-described samples of the photovoltaic device were measured by the foregoing method. The relationship between the average particle size of ZnO and the short-circuit current (Jsc) is shown in the graph of FIG. 5, where the short-circuit current (Jsc) is a value normalized with the value which was obtained in Comparative Example 3 (described below) and which does not include the granules of ZnO.

Figure 5:
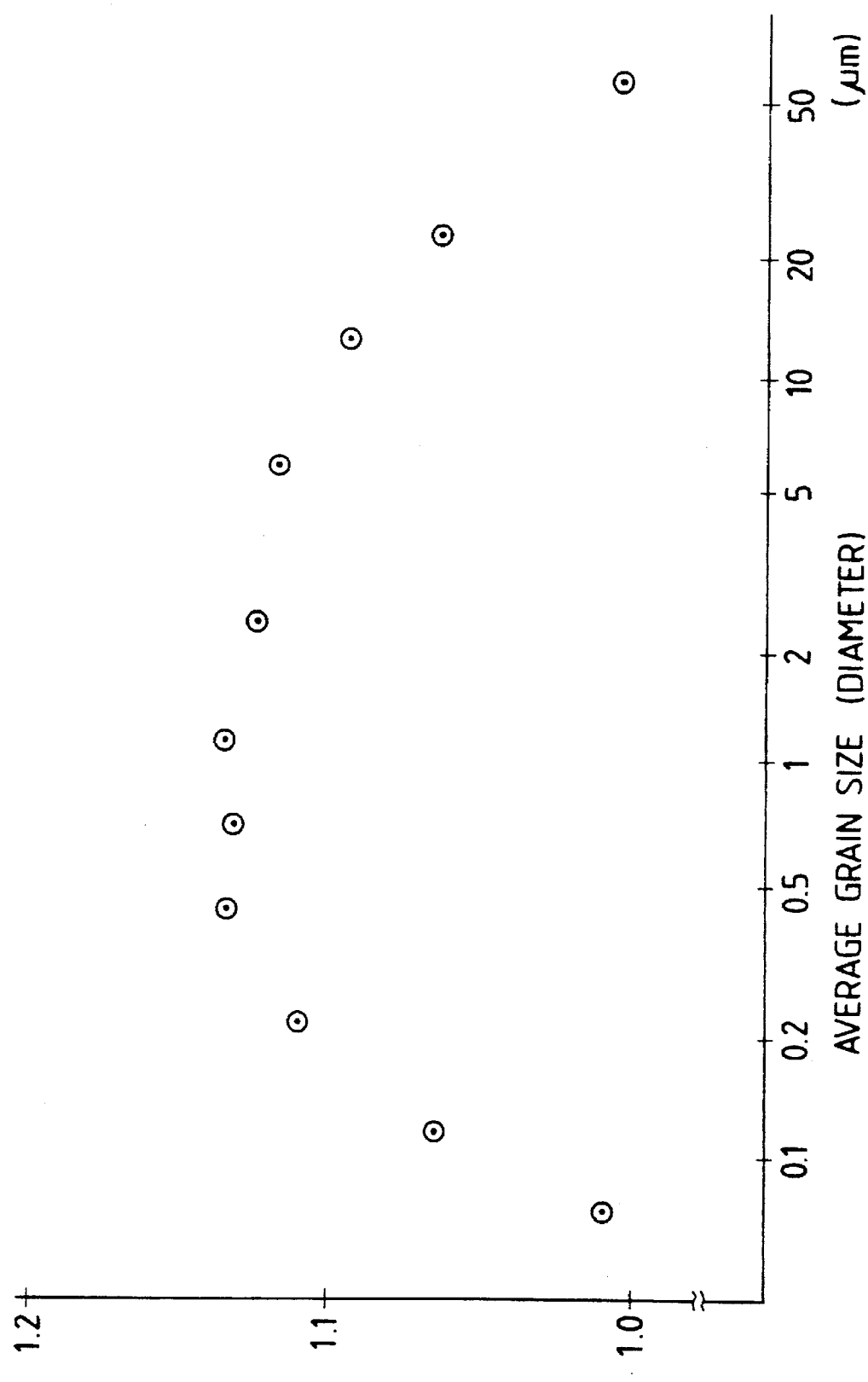
FIG. 5 is a graph showing the relationship between the average particle size of granules of a photovoltaic device according to the present invention and the normalized short-circuit current (Jsc)

As can be seen from FIG. 5, the short-circuit current (Jsc) depends considerably on the average particle size of the ZnO granules. It is preferable that the diameter is from 0.1 µm to 20 µm, more preferably from 0.2 µm to 10 µm, most preferably from 0.3 µm to 5 µm.

Furthermore, 10 types of samples were manufactured which were varied in the surface density S for 0.11 to 0.95 in the case where ZnO granules having an average particle size of 0.41 µm were disposed to form a layer 302 in the EVA layer 301.

The characteristics of each sample as a photovoltaic device were measured similarly to the foregoing measurement. The relationship between the surface density S of ZnO and the short-circuit current (Jsc) is shown in the graph of FIG. 6, where the short-circuit current (Jsc) is a value normalized with the value which was obtained in Comparative Example 3 (described below) which does not include the granules of ZnO.

Figure 6:
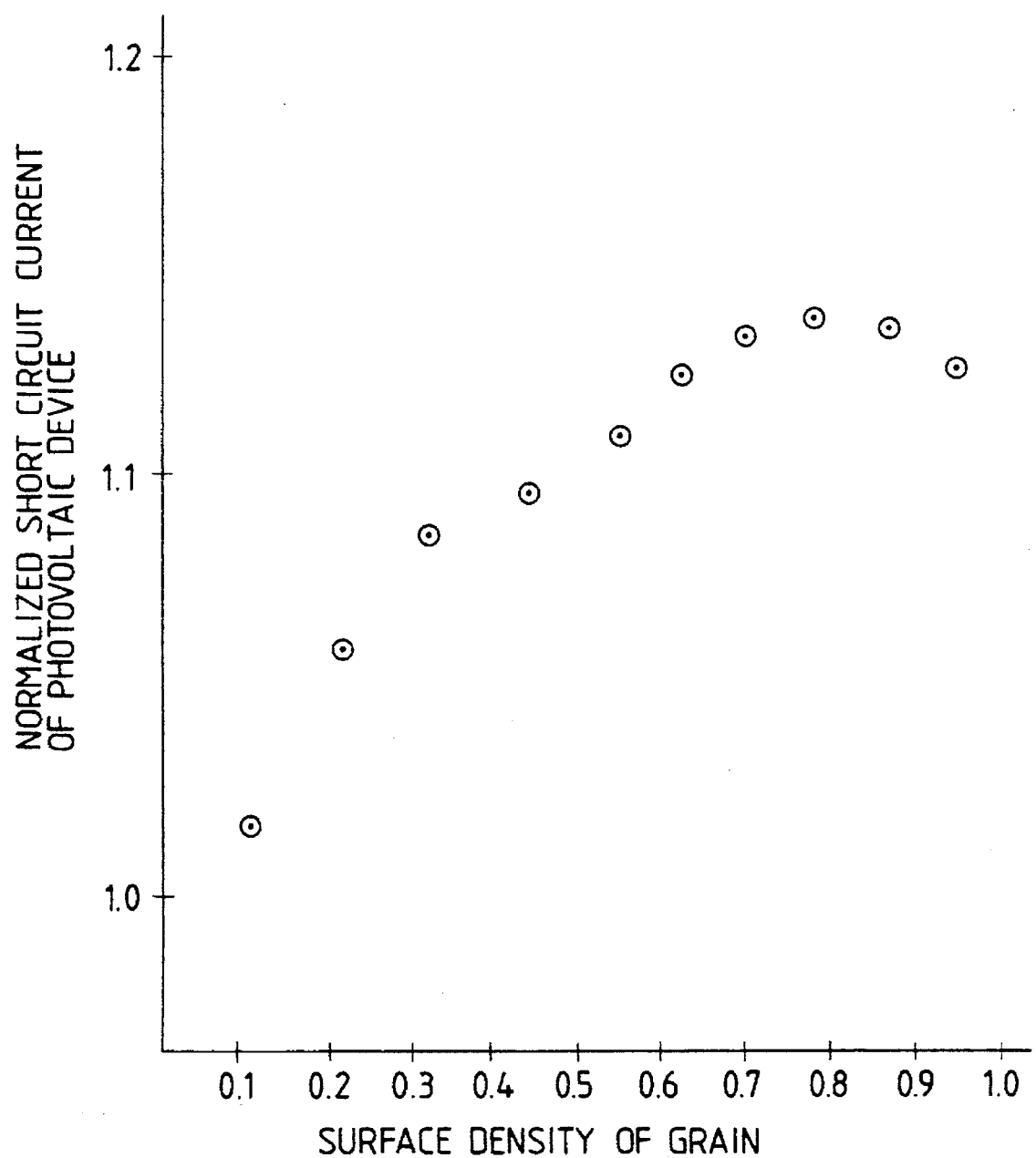
FIG. 6 is a graph showing the relationship between the surface density of granules of a photovoltaic device according to the present invention disposed to form a layer and the normalized short-circuit current (Jsc)

As can be seen from FIG. 6, the short-circuit current (Jsc) considerably depends upon the surface density S of the granules. It is preferable that the value of the surface density S is 0.2 or more, more preferably 0.4. It can be considered that scattering of light cannot take place satisfactorily if the surface density of the granules is too low. If the surface density is higher than 0.9, the scattering of light took place satisfactorily. However, the adhesion of the surface protection layer on the layer of granules deteriorated.

Results of the evaluation of the characteristics of the samples as photovoltaic devices in which ZnO granules having an average particle size of 1.1 µm were disposed to form a layer at a surface density of 0.78 are shown in Table 1 (however, the characteristics of the photovoltaic device are normalized with the values obtained in Comparative Example 3 described later).

Figure 7:
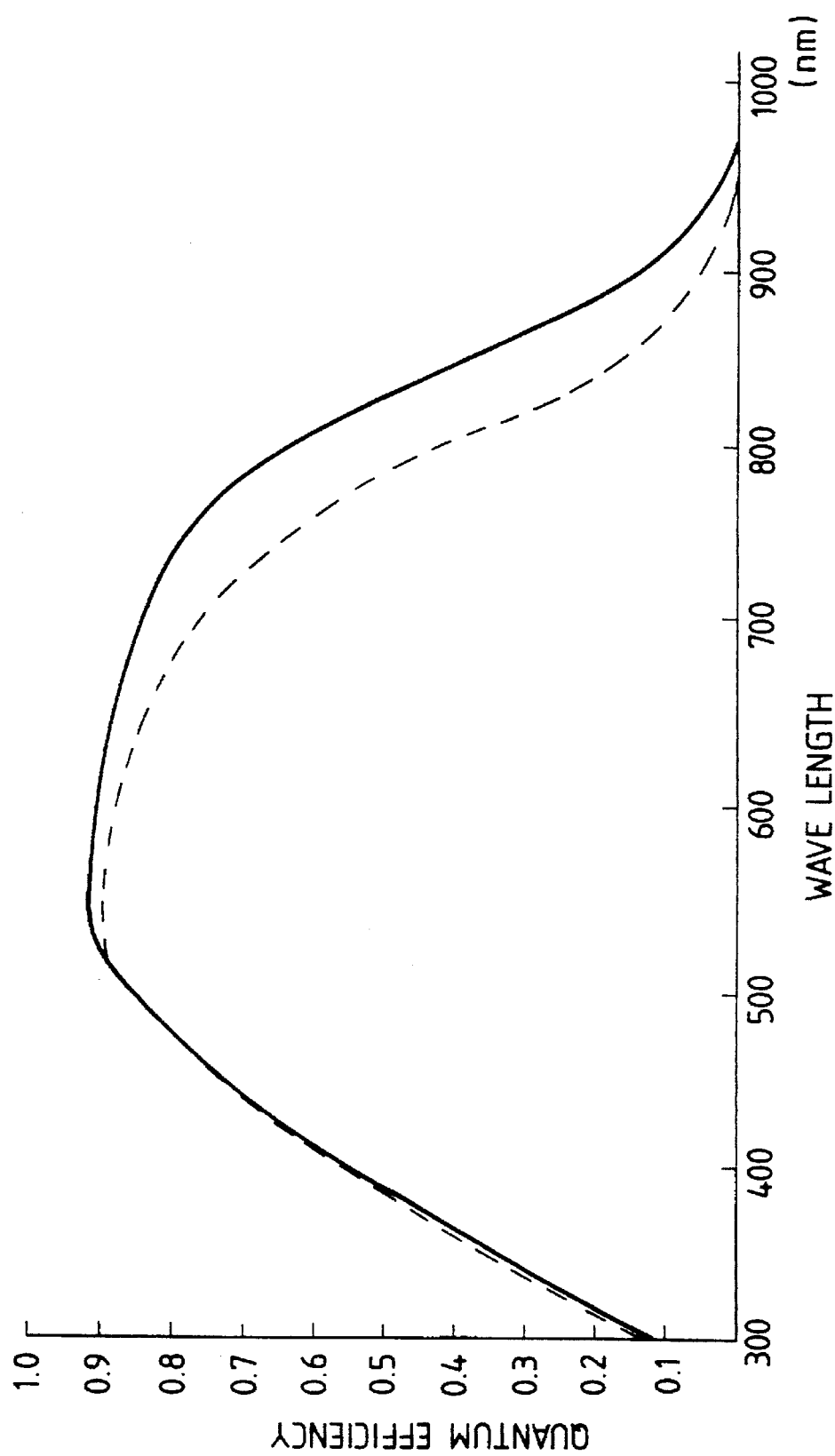
FIG. 7 is a graph showing the spectral sensitivity of an example of a photovoltaic device according to the present invention.

The spectral sensitivity of the photovoltaic devices was measured, the results being designated by the solid line of FIG. 7. The ordinate of FIG. 7 gives the ratio (quantum efficiency) of the number of photons outputted as an electric current with respect to the number of photons incident on the photovoltaic device.

COMPARATIVE EXAMPLE 3

Ten so-called single layer a-SiGe photovoltaic devices of 10 cm×10 cm were manufactured in such a manner that the granules 302 according to Example 5 were not mixed with the surface protection layer but the balance of the cell arrangement was the same as that according to Example 1.

The characteristics of the photovoltaic devices were measured and the average values of the measured values evaluated similarly to Example 5. Furthermore, the spectral sensitivity of the photovoltaic device was measured similarly to Example 5, resulting in the dashed line of FIG. 7.

As can be seen from FIG. 7 and Table 1, the photovoltaic device in which the granules were disposed to form a layer in the surface protection layer exhibited improved spectral sensitivity in the long wavelength region, a satisfactory short-circuit current (Jsc) was obtained, and the photoelectric conversion efficiency (η) was improved, as seen from a comparison between Example 5 and Comparative Example 3.

TABLE 1

| Example | Example 5 | Comparative Example 3 |
| --- | --- | --- |
| Granules | Present | Not Present |
| Voc | 1.001 | 1 |

TABLE 1-continued

| Example | Example 5 | Comparative Example 3 |
| --- | --- | --- |
| Jsc | 1.128 | 1 |
| FF | 1.042 | 1 |
| η | 1.175 | 1 |

EXAMPLE 6

Figure 8:
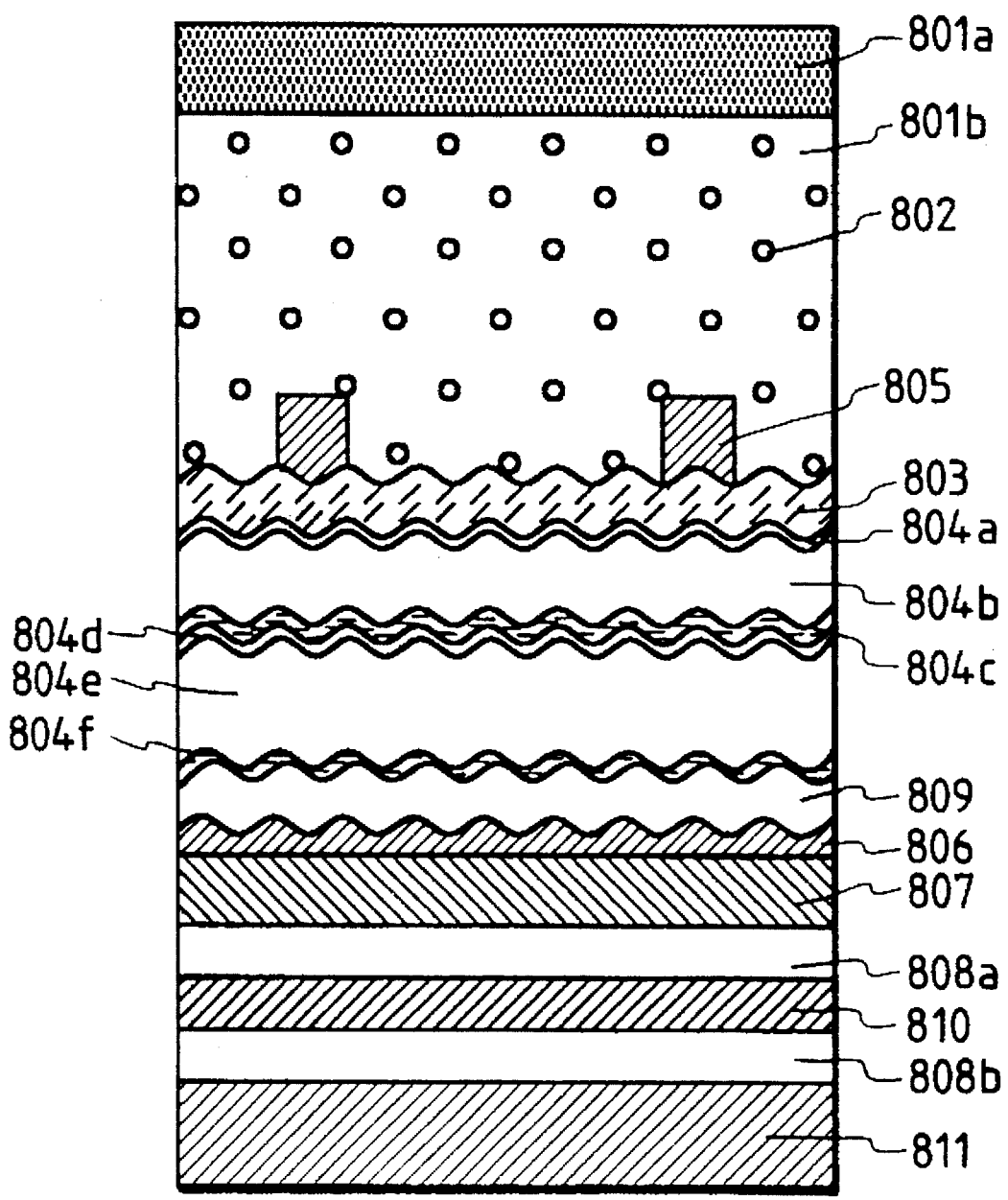
FIG. 8 is a schematic cross-sectional view which illustrates another example of a photovoltaic device according to the present invention.

A photovoltaic device according to Example 6 of the present invention and shown in FIG. 8 was manufactured by the following process.

FIG. 8 illustrates a tandem stacked-type photovoltaic device constituted by stacking two pin junctions. Referring to FIG. 8, reference numerals 801a and 801b represent surface protection layers which are categorized as an upper transparent member 801a and an adhesion layer 801b depending upon the function. Reference numeral 802 represents granules, 803 represents a transparent electrode, 804a, 804b, 804c, 804d, 804e, and 804f represent semiconductor layers, 805 represents a front electrode, 806 represents a back electrode, 807 represents a substrate, and 808a and 808b represent adhesive layers. Reference numeral 809 represents a transparent conductive layer, 810 represents an insulating layer, and 811 represents a support member also serving as a back side protection layer. The transparent conductive layer 809 according to this embodiment acts similarly to Example 5.

As shown in FIG. 8, the photovoltaic device according to this example has an arrangement wherein the granules 802 are uniformly distributed in the surface protection layer 801.

As the substrate 807, a stainless steel sheet exhibiting a surface roughness Rmax of 0.1 μm or less, a thickness of 0.15 mm, width of 32 cm, and a length of 15 mm was cleaned and subjected to the following process by a so-called roll-to-roll method in which the process was performed while continuously moving the substrate from a delivery roll to a winding roll.

First, an RF magnetron sputtering apparatus using RF of 13.56 MHz was used to form the back electrode 806 of Ag having an average thickness of 0.4 μm. By performing sputtering while heating the substrate at 380° C., a surface contour having projections and pits capable of scattering light of 0.6 μm PJnax was manufactured. Then, zinc oxide (ZnO) was formed to a thickness of 0.4 μm by the foregoing RF sputtering method, whereby the transparent conductive layer 809 was formed.

Then, a glow discharge (GD) method was employed, wherein the following semiconductor layers were formed. First, the a-Si layer 804f, which was a first n-type semiconductor layer, was formed while heating the substrate at 300° C. Then, the a-SiGe layer 804e, which was a first i-type semiconductor layer, was formed on the a-Si layer 804f while heating the substrate at 280° C. When an i-type a-SiGe layer deposited on a glass substrate to a thickness of 1 μm under the same film forming conditions was evaluated, an optical band gap (Eg) of 1.44 eV was exhibited.

Furthermore, the i-type a-SiGe layer 804e included, adjacent to each of the n-layer and the p-layer, so-called buffer layers in which a-SiGe was continuously changed to a-Si and which has a thickness of 30 nm.

Then, the following layers were consecutively formed as follows: the microcrystalline silicon layer 804d, which was a first p-type semiconductor layer, was formed to a thickness of 5 nm while heating the substrate at 260° C.; the a-Si layer 804c, which was the second n-type semiconductor layer, was formed to a thickness of 20 nm while heating the substrate at 240° C.; the a-Si layer 804b, which was the second i-type semiconductor layer, was formed to a thickness of 220 nm while heating the substrate at 240° C.; the microcrystalline silicon layer 804a, which was the second p-type semiconductor layer, was formed to a thickness of 4 nm while heating the substrate at 200° C.

Then, a DC magnetron sputtering apparatus was used to evaporate ITO to a thickness of 70 nm while heating the substrate at 170° C. As a result, the transparent electrode 803 was formed, and then the photovoltaic device was separated into sections each 10 cm×10 cm. Then, the substrate was cut along etching lines. Then, an electron beam evaporating method was employed to evaporate Al to form a pattern as shown in FIG. 4. As a result, the front electrode 805 was formed. Then, output electrodes (not shown) were connected to the end portions of the back electrode and the front electrode.

Then, EVA layer 808b melted at 80° C. was applied to the supporting member 811 made of a steel plate applied with zinc plating and having a thickness of 0.30 mm. Then, a nylon film serving as the insulating layer 810 and having a thickness of 50 mm was bonded on the supporting member 811. Then, EVA layer 808a was applied on the insulating layer 810, and a photovoltaic device in which the front electrode 805 and the other layers were formed prior to forming the front electrode 805 was bonded to the EVA layer 808a.

By employing a gas phase reaction method in which zinc vapor is oxidized, ZnO granules 802 were formed and mixed with EVA melted at 80° C. Eleven types of samples having a volume density V of the granules contained in EVA forming the surface protection layer varying from 0.0006 to 0.52 were manufactured by changing the quantity of the mixed-in ZnO granules. Furthermore, the average particle size of the ZnO granules was 1.1 μm.

Then, EVA with which the ZnO granules were mixed and which had a thickness of 150 μm was applied to the surface of the photovoltaic device in which the front electrode 805 and the other layers formed prior to forming the front electrode 805 were formed. Then, a PVF film having a thickness of 40 mm and serving as the upper transparent member 801a was bonded to the EVA, so that a photovoltaic device having a layer structure as shown in FIG. 8 was formed. Finally, the overall body was heated at 150° C. for one hour, so that the EVA forming the adhesive layers was hardened. Consequently, the photovoltaic device as shown in FIG. 8 was manufactured. As a result of the foregoing process, ten Si/SiGe two junction tandem stacked-type photovoltaic devices each 10 cm×10 cm were manufactured.

Then, the average characteristics of the photovoltaic devices having a parallel resistance of 1 KΩ or more per 1 cm², such as the open circuit voltage (Voc), the short-circuit current (Jsc), the fill factor (FF), and the photoelectric conversion efficiency (η) were measured by using a solar simulator at 25° C. irradiated with a pseudo solar light of AM 1.5 and 100 mW/cm².

The relationship between the density per volume of the granules and the short-circuit current (Jsc) of the photovoltaic devices having surface protection layers in which the volume density V of the ZnO granules was changed is shown in a graph of FIG. 9, where the short-circuit current (Jsc) is a value normalized with a value which was obtained in Comparative Example 4 which does not include the granules of ZnO (described below).

Figure 9:
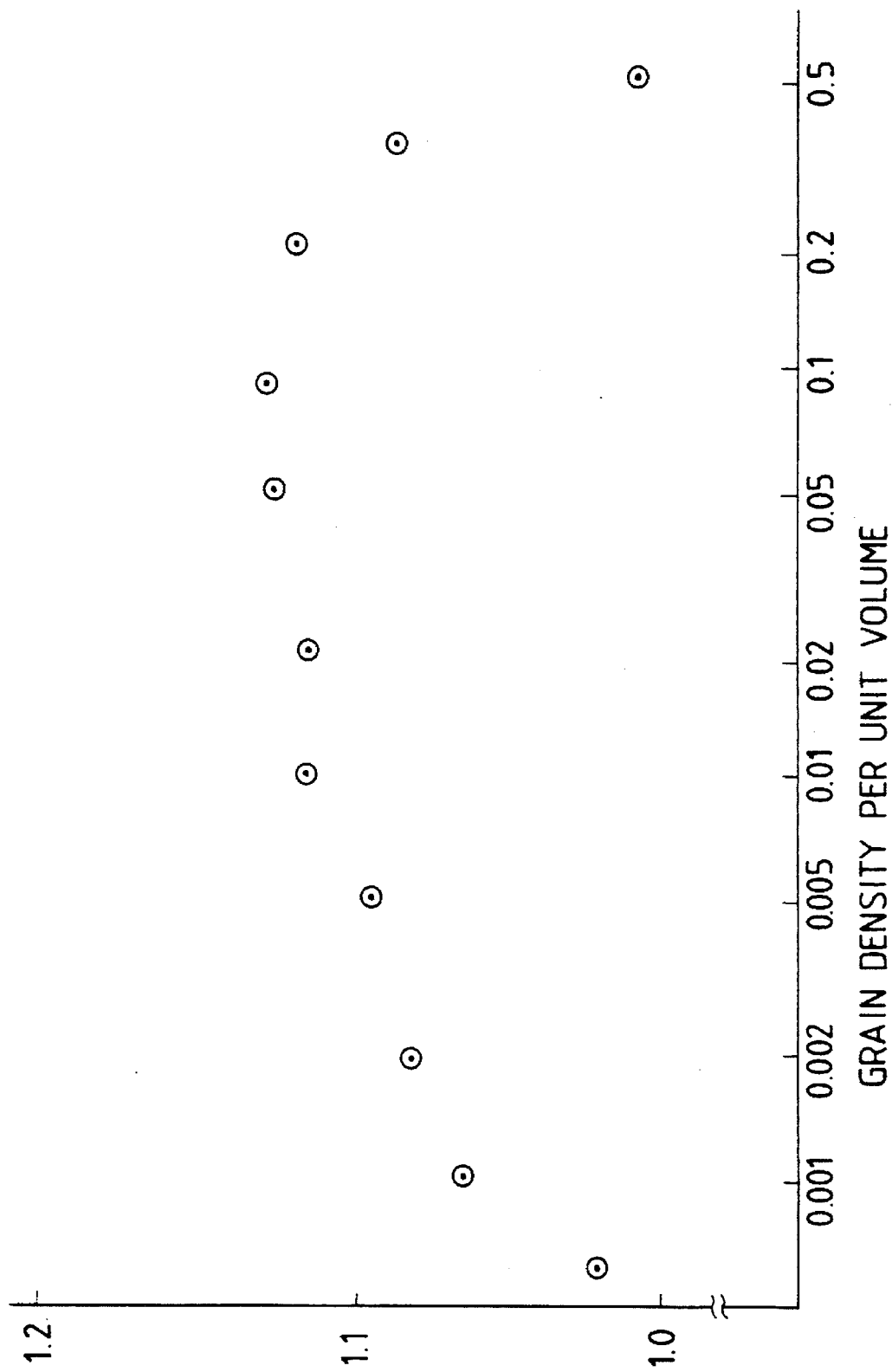
FIG. 9 is a graph which illustrates the relationship between the density per volume of the granules uniformly contained in the surface protection layer of the photovoltaic device according to the present invention and the normalized short-circuit current (Jsc)

As can be seen from FIG. 9, it is preferable that the volume density V is from 0.001 to 0.5, more preferably from 0.01 to 0.3. The reason for this is that the scattering of light due to the granules is insufficient if the density of the granules in the surface protection layer is too low. If the density is too high, the total transmittance of the surface protection layer deteriorates.

Results of the evaluation of the characteristics of the samples of the photovoltaic devices in which ZnO granules having an average particle size of 1.1 μm were mixed with the EVA at a volume density of 0.09 are shown in Table 2; however, the characteristics of the photovoltaic devices are standardized with the values obtained in Comparative Example 4 described below.

COMPARATIVE EXAMPLE 4

Ten so-called Si/SiGe two junction tandem stacked-type photovoltaic devices each 10 cm×10 cm were manufactured by a method similar to Example 6 except the granules 802 were not included. Similarly to Example 6, the characteristics of the photovoltaic devices were measured and their average values determined.

As can be seen from Table 2, the photovoltaic device according to the present invention and including granules in the surface protection layer improved the short-circuit current (Jsc) of the Si/SiGe tandem junction cell, causing the total short-circuit current (Jsc) and the fill factor (FF) to be improved. As a result, the photoelectric conversion efficiency (η) was improved.

TABLE 2

| Example  | Example 6 | Comparative Example 4 |
| --- | --- | --- |
| Granules | Present | Not Present |
| Voc | 1.001 | 1 |
| Jsc | 1.128 | 1 |
| FF | 1.042 | 1 |
| η | 1.175 | 1 |

EXAMPLE 7

A photovoltaic device according to Example 7 of the present invention was manufactured by the following process.

Figure 10:
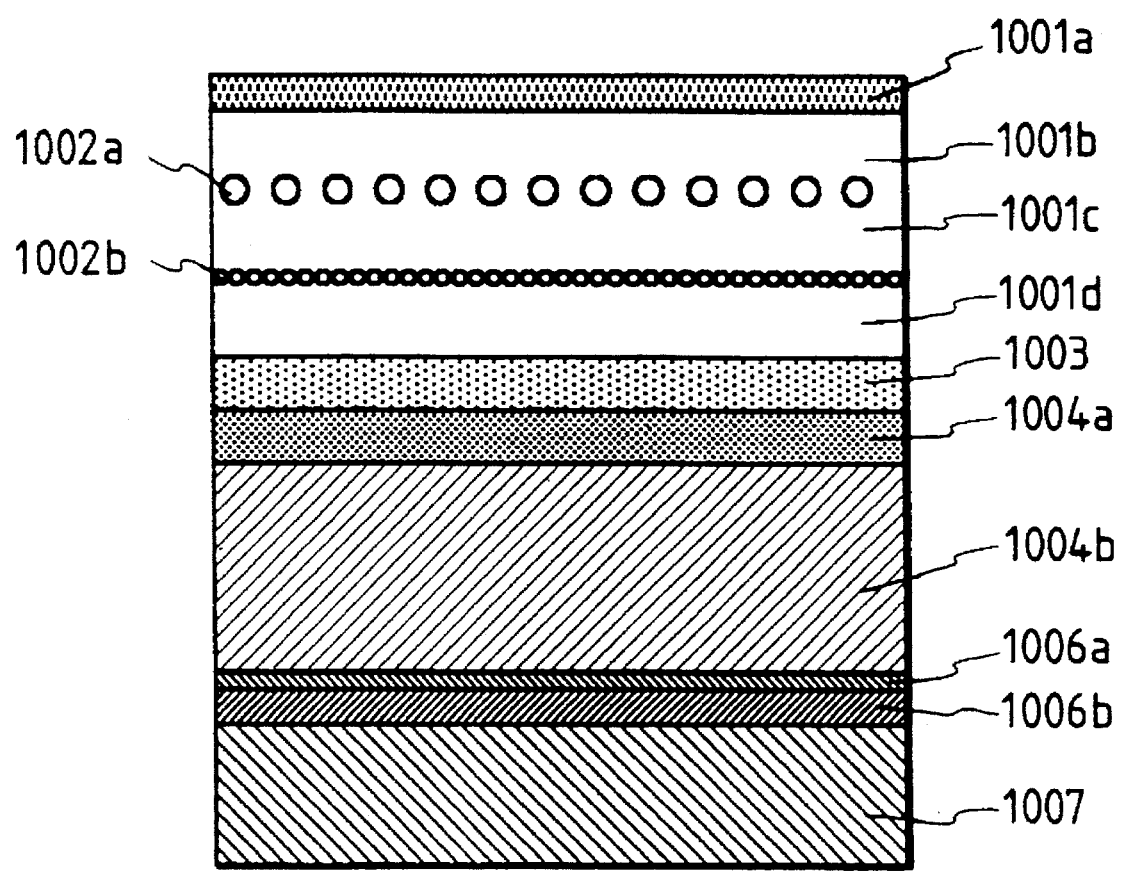
FIG. 10 is a schematic cross-sectional view which illustrates another example of a photovoltaic device according to the present invention.

FIG. 10 illustrates an example of a photovoltaic device according to the present invention having a Group II–VI compound semiconductor layer. This example has an arrangement wherein granules formed into a plurality of layers are disposed in the surface protection layer. Furthermore, the particle size of the granules disposed to form the plurality of the layers and the density thereof are changed.

Referring to FIG. 10, reference numerals 1001a, 1001b, 1001c, and 1001d represent surface protection layers which are categorized as an upper transparent member 1001a, and adhesive layers 1001b, 1001c, and 1001d depending upon their function. Reference numerals 1002a and 1002b represent layers of granules having different particle sizes, 1003 represents a transparent electrode, 1004a represents an n-type CdS semiconductor layer, 1004b represents a p-type CdTe semiconductor layer, 1006a and 1006b represent back electrodes, and 1007 represents a substrate also serving as a back side protection layer. The front electrode on the transparent electrode 1003 is omitted from illustration.

As the substrate 1007, a polyethylene terephthalate (PET) film formed into a sheet and exhibiting a surface roughness Rmax of 0.1 μm or less, and having a thickness of 0.18 mm, a width of 32 cm, and a length of 10 mm was cleaned. Then a so-called roll-to-roll method similar to that according to Example 6 was employed wherein the following process was performed.

Initially, a conventional DC magnetron sputtering apparatus was used to deposit a layer of aluminum 300 nm thick as back electrode 1006b. A similar DC magnetron sputtering apparatus was then used to deposit a gold layer to a thickness of 20 nm as back electrode 1006a. Semiconductor layers 1004a and 1004b were formed by depositing a p-type CdTe layer 1004b to a thickness of 1.5 μm by a conventional evaporation method while heating the substrate at 160° C. Thereafter, an n-type CdS layer 1004a was deposited to a thickness of 0.1 μm by a conventional evaporation method while heating the substrate at 105° C. Then, a known DC magnetron sputtering apparatus was used to deposit a layer of ITO of a thickness of 200 nm while heating the substrate at 170° C. As a result, the transparent electrode 1003 was formed. Then, a heat treatment at 120° C. for one hour was performed in an atmosphere of $N_2$. Then, the photovoltaic device was separated into sections each 10 cm×10 cm by etching, and the substrate was cut along the etching lines. Then, silver paste was screen-printed, and was dried at 125° C., so that the front electrode (not shown) was formed. Furthermore, output electrodes (not shown) were connected to the end portions of the transparent electrode and the front electrode.

Then, a gas phase reaction method using $TiCl_4+O_2$ was employed, so that granules of $TiO_2$ (refractive index 2.3) were formed. By changing the temperature of the reaction and the concentration of the reaction gas at this time, two types of granules having respective average particle sizes of 0.2 μm and 0.7 μm were manufactured.

Then, polyvinyl butyral (PVB) was applied to a thickness of 100 μm, whereby the adhesive layer 1001d was formed. Then, $TiO_2$ granules 1002b having a particle size of 0.2 μm was uniformly sprayed to form a layer on the PVB layer 1001d having a surface density S of 0.65. Then, PVB forming the adhesive layer 1001c was applied to a thickness of 100 μm on the granules 1002b. Then, the $TiO_2$ granules 1002a having an average particle size of 0.7 μm were uniformly sprayed to form a layer having a surface density S of 0.35. Then, silicon resin forming the adhesive layer 1001b was applied to a thickness of 100 μm. Furthermore, a PVF film having a thickness of 30 μm and serving as the upper transparent member 1001a was bonded at the uppermost position.

As a result, 100 CdS/CdTe photovoltaic devices as shown in FIG. 10 and each 10 cm×10 cm were manufactured.

Then, the average of the characteristics of the photovoltaic device having a parallel resistance of 1 KΩ or more per 1 cm² such as the open circuit voltage (Voc), the short-circuit current (Jsc), the fill factor (FF), and the photoelectric conversion efficiency (η) were measured by using a solar simulator at 25° C. irradiated with a pseudo solar light of AM 1.5 and 100 mW/cm². Results of measurements of the characteristics of the photovoltaic devices are shown in Table 3. However, the characteristics of the photovoltaic device are normalized with the values of Comparative Example 5 described below.

EXAMPLE 8

By a method similar to Example 7, except that the second granules 1002a were not used, 100 CdS/CdTe photovoltaic devices each 10 cm×10 cm were manufactured. The characteristics required for the photovoltaic device were measured similarly to Example 7, and the average values were obtained.

COMPARATIVE EXAMPLE 5

By a method similar to Example 7 except that the granules 1002a and 1002b were not used, 100 CdS/CdTe photovoltaic devices each 10 cm×10 cm were manufactured. The characteristics of the photovoltaic device were measured similarly to Example 7, and the average values were obtained.

As can be seen from Table 8, the photovoltaic devices according to the present invention in which the granules were disposed to form a plurality of layers in the surface protection layer enabled the short-circuit current (Jsc) and the photoelectric conversion efficiency ($\eta$) to be improved. Furthermore, when the granules disposed to form a single layer were changed to two layers, and the particle size of the granules in the upper layer was larger than that of the granules in the lower layer, the surface density in the upper layer was smaller than that in the lower layer. As a result, the scattering of light in the surface protection layer was enhanced with substantially no deterioration in the total transmittance of the surface protection layer. As a result, the length of the optical path in the semiconductor layer was increased. As a result, when the number of the granule layers was increased from one to two, the short-circuit current (Jsc) and the photoelectric conversion efficiency ($\eta$) were improved.

TABLE 3

| Example | Example 7 | Example 6 | Comparative Example 5 |
|---------|-----------|-----------|-----------------------|
| Granules | Double Layer | Single Layer | No Layer |
| Voc | 0.999 | 1.000 | 1 |
| Jsc | 1.143 | 1.089 | 1 |
| FF | 1.002 | 1.001 | 1 |
| $\eta$ | 1.144 | 1.090 | 1 |

EXAMPLE 9

Figure 11:
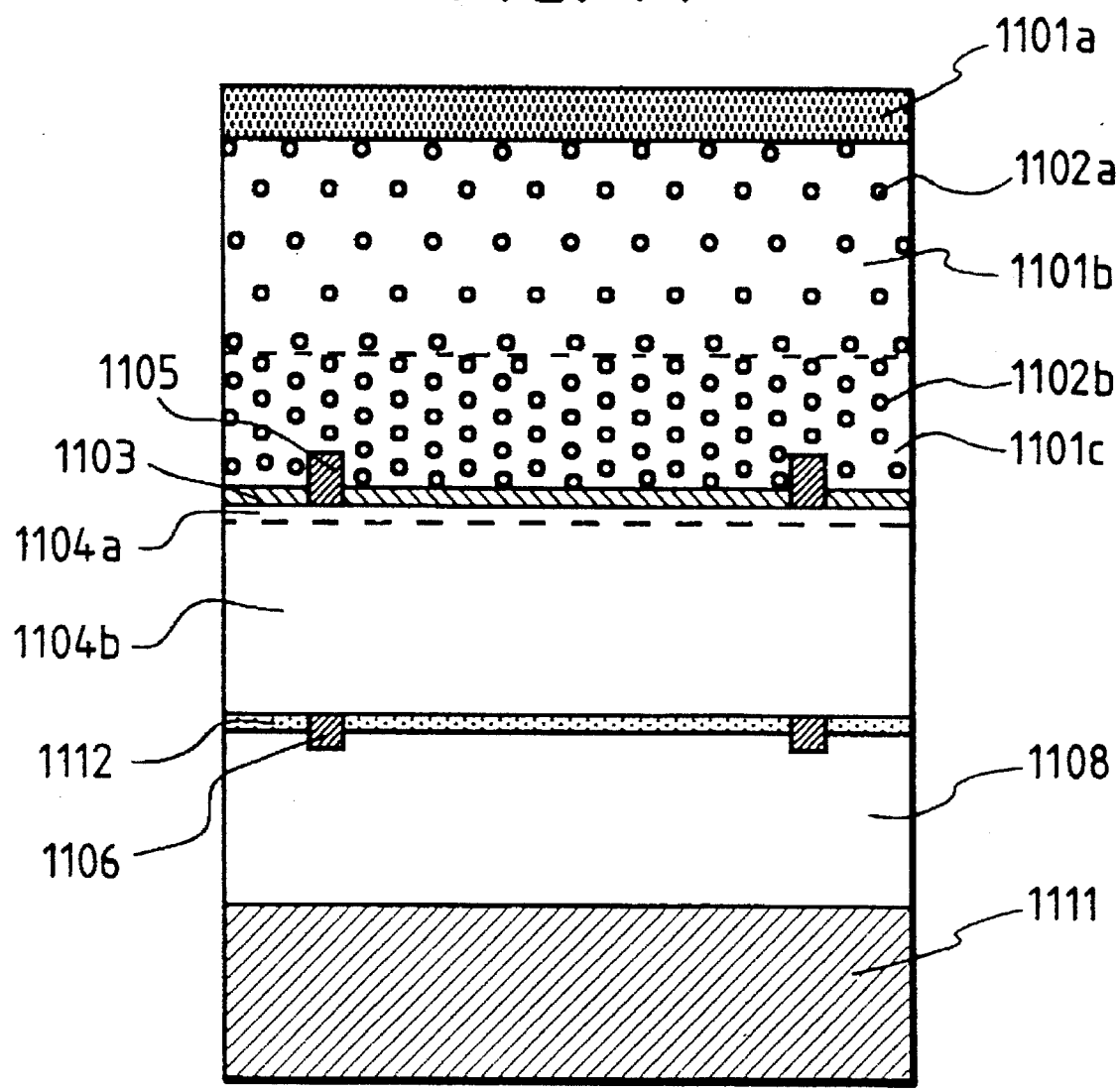
FIG. 11 is a schematic cross-sectional view which illustrates another example of a photovoltaic device according to the present invention.

Another example of the photovoltaic device according to the present invention and shown in FIG. 11 was manufactured. This example is characterized in that plural types of surface protection layers depending upon the density of the granules mixed per unit volume were used. FIG. 11 illustrates an example of the photovoltaic device according to the present invention in which polycrystalline silicon is used to form the semiconductor layers.

Referring to FIG. 11, reference numerals 1101a, 1101b, and 1101c represent surface protection layers which are divided, depending upon their function, into an upper transparent member 1101a and filler layers 1101b and 1101c. Reference numerals 1102a and 1102b represent granules, 1103 represents an anti-reflection layer or a transparent electrode which also serves as an anti-reflection layer, and 1104a and 1104b represent polycrystalline silicon semiconductor layers. The polycrystalline silicon semiconductor layer 1104a is a portion of polycrystalline substrate 1104b converted into an opposite conductivity type. Reference numeral 1106 represents a back electrode, 1108 represents a back-side filler layer, 1111 represents a supporting member also serving as a back-side protection layer, and 1112 represents a back-side passivation layer of the semiconductor substrate.

First, a p-type polycrystalline silicon substrate 1104b formed by a casting method was provided, and the surface of the substrate was cleaned. Then, the surface thereof was converted to n⁺type layer 1104a by an ion implantation method, so that a pn junction was formed.

Then, a $SiO_2$ passivation layer (not shown) having a thickness of 5 nm was formed on the surface of the polycrystalline silicon substrate in which the pn junction was formed. Then, a $Si_3N_4$ passivation layer 1112 having a thickness of 200 nm was formed on the back side of the polycrystalline silicon substrate.

Then, Ti and Ag front electrode 1105 and back electrode 1106 were formed on the two sides of the polycrystalline substrate.

A known DC magnetron sputtering apparatus was then used to form the transparent electrode 1103 also serving as an anti-reflection layer and having a thickness of 0.2 μm by employing $Ta_2O_5$ while heating the substrate at 200° C. Furthermore, output electrodes (not shown) were formed at the end portions of the front electrode 1105 and the back electrode 1106.

Then, a gas phase reaction method using $SiCl_4+NH_3$ was employed, wherein $Si_3N_4$ granules having an average particle size of 0.3 μm were formed. Then, $Si_3N_4$ granules were mixed with EVA melted at 80° C. At this time, two types of EVA, with granule volume densities V of 0.05 and 0.005, were manufactured by changing the quantity of the mixed $Si_3N_4$ granules.

Then, the EVA 1101c having the granule volume density V of 0.05 and a thickness of 100 μm was applied to a photovoltaic device in which the front electrode and the other layers were formed prior to forming the front electrode. Then, the EVA 1101b having the granule volume density V of 0.005 and a thickness of 200 μm was applied to the EVA 1101c. Then, a PVF film serving as the upper transparent member 1101a was bonded to the uppermost position.

Then, EVA filler layer 1108 was applied to the supporting member 1111 having a thickness of 1 mm and made of an Al plate, and the foregoing photovoltaic device was bonded thereto.

Then, the overall body was heated at 150° C. for one hour to harden the EVA, whereby the photovoltaic device according to the present invention shown in FIG. 11 was manufactured. As a result of the foregoing process, 50 polysilicon photovoltaic devices as shown in FIG. 11 each 10 cm×10 cm were manufactured.

Then, the averages of the characteristics of the photovoltaic devices having a parallel resistance of 1 KΩ or more per 1 cm² such as the open circuit voltage (Voc), the short-circuit current (Jsc), the fill factor (FF), and the photoelectric conversion efficiency ($\eta$) were measured by using a solar simulator at 25° C. irradiated with a pseudo solar light of AM 1.5 and 100 mW/cm². Results of evaluations of the characteristics of the photovoltaic devices are shown in Table 4 (however, the characteristics of the photovoltaic devices are normalized with respect to the values of Comparative Example 6 described later).

EXAMPLE 10

Fifty polycrystalline silicon photovoltaic devices each 10 cm×10 cm were manufactured by a method similar to Example 9 except that only one layer of EVA having a volume density V of $Si_3N_4$ granules of 0.02 was applied to a thickness of 300 μm in place of layers 1101b and 1101c. Similarly to Example 9, the characteristics of the photovoltaic devices were measured to obtain average values.

COMPARATIVE EXAMPLE 6

Fifty polycrystalline silicon photovoltaic devices each 10 cm×10 cm were manufactured by a method similar to Example 4 except that the granules were not mixed with EVA, i.e., only EVA was applied to the photovoltaic device to a thickness of 300 μm. Similarly to Example 9, the characteristics of the photovoltaic devices were measured to obtain average values.

As can be seen from Table 4, the photovoltaic device according to the present invention having $Si_3N_4$ granules in the surface protection layer thereof improved the short-circuit current (Jsc) and the photoelectric conversion efficiency (η). In addition, use of plural types of surface protection layers in which the volume density V of the granules was changed in the surface protection layer further enhanced the scattering of light as compared with a single-layer structure in which the volume density V was constant. As a result, the length of the optical path in the semiconductor layer can be increased. Therefore, the short-circuit current (Jsc) and the photoelectric conversion efficiency (η) were further improved.

TABLE 4

| Example | Example 9 | Example 10 | Comparative Example 6 |
| --- | --- | --- | --- |
| Granules | Double Layer | Single Layer | No Layer |
| Voc | 1.000 | 1.001 | 1 |
| Jsc | 1.122 | 1.097 | 1 |
| FF | 1.001 | 1.001 | 1 |
| η | 1.123 | 1.099 | 1 |

EXAMPLE 11

Figure 12:
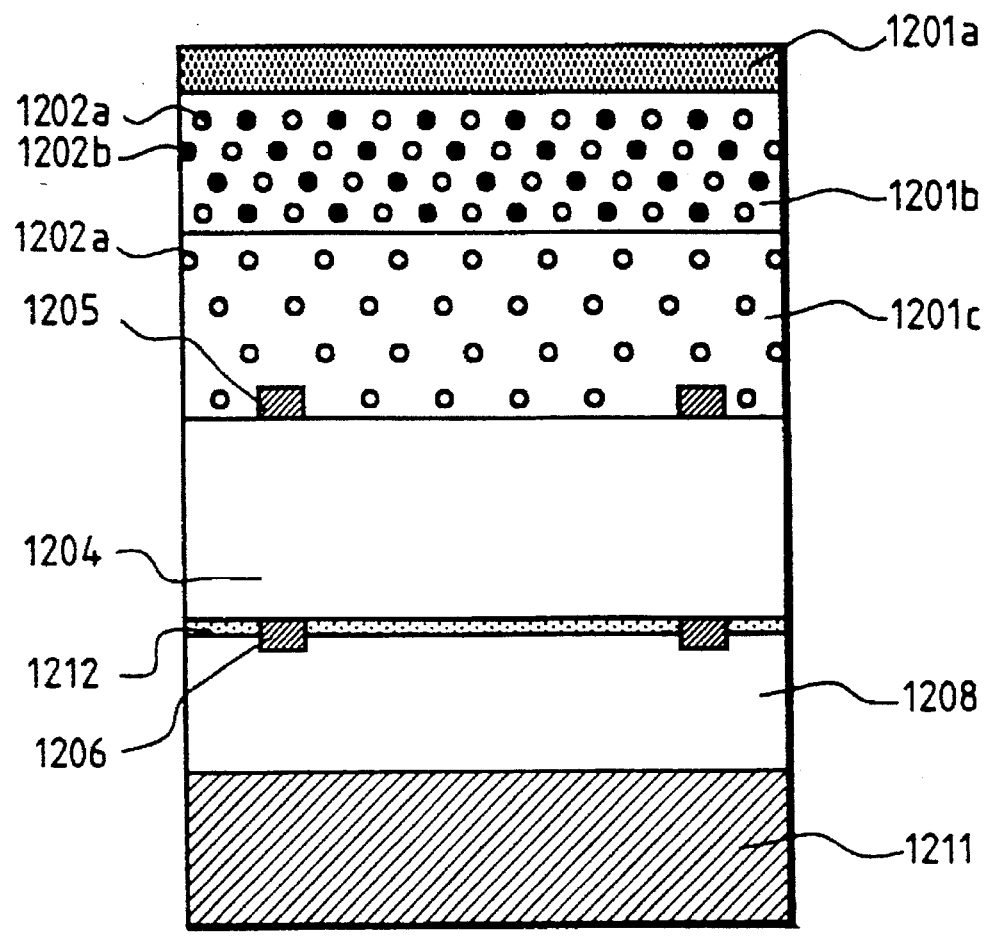
FIG. 12 is a schematic cross-sectional view which illustrates another example of a photovoltaic device according to the present invention.
Figure 13:
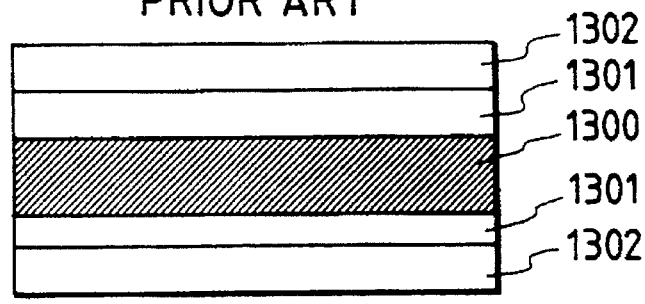
FIG. 13 is a schematic cross-sectional view which illustrates an example of a conventional solar cell module.

Another example of the photovoltaic device according to the present invention shown in FIG. 12 was manufactured by the following process.

This example of the photovoltaic device according to the present invention has a semiconductor layer made of a single-crystal GaAs. This example is characterized in that the surface protection layer includes plural types of granules depending upon the material, and plural types of surface protection layers depending upon the particle size and the density per volume of the granules were formed.

First, an n-type GaAs wafer 1204 having a thickness of 200 μm was provided, and an MOCVD method was employed to form an n-type GaAs layer in which sulfur (S) was doped and which had a thickness of 5.0 μm. Then, the MOCVD method was again employed to sequentially form the following layers (not shown): a p-type GaAs layer in which Zn was doped and which had a thickness of 0.5 μm; a p-type AlGaAs layer in which Zn was doped and which had a thickness of 0.15 μm; and a p-type GaAs layer in which Zn was doped and which had a thickness of 0.5 μm. As a result, a pn junction was formed (not shown).

Then, a reflection prevention layer (not shown) having a thickness of 75 nm and made of $Si_3N_4$ was formed on the GaAs wafer 1204 in which the pn junction was formed.

Then, a passivation layer 1212 having a thickness of 200 nm and made of $Si_3N_4$ was formed on the back side of the GaAs wafer. Then, Ti and Ag front electrode 1205 and back electrode 1206 were formed on the two sides of the GaAs waver.

Then, the photovoltaic device in which the front electrode 1205 and other layers formed prior to forming the electrode 1205 were formed was bonded to a supporting member 1211 having a thickness of 1 mm and made of an Al plate by applying EVA adhesive layer 1208. At this time, output electrodes (not shown) were formed at end portions of the front electrode 1205 and the back electrode 1206.

Magnesium fluoride ($MgF_2$) granules 1202a obtained by heating magnesium carbonate and hydrofluoric acid were then prepared, the $MgF_2$ granules having an average particle size of about 1.5 μm. The $MgF_2$ granules were mixed with EVA melted at 80° C. to make the volume density V 0.005. EVA 1201c mixed with the MgF2 granules was, to a thickness of 100 μm, applied to the photovoltaic device in which the front electrode 1205 and the other layers to be formed prior to forming the front electrode 1202 were formed.

On the other hand, granules 1202b made of ZnS (a white pigment) and having an average particle size of 0.7 μm were, together with the foregoing $MgF_2$ granules 1202a, mixed with EVA melted at 80°. At this time, the density per volume of the $MgF_2$ granules 1202a in EVA was 0.01 and the density per volume of the ZnS granules 1202b was 0.04. The EVA layer 1201b mixed with the $MgF_2$ and ZnS granules was applied, to a thickness of 100 μm, to the EVA layer 1201c in which the foregoing $MgF_2$ granules were mixed.

Then, the PVF film 1201a, as an upper transparent member, was bonded to the EVA layer 1201b while deaereating the PVF film 1201a. Then, the overall body has heated at 150° C. for one hour to harden the EVA, so that the photovoltaic device according to the present invention shown in FIG. 12 was manufactured. As a result of the aforesaid process, 20 GaAs photovoltaic devices each having a diameter of 3 inches were manufactured.

Then, the averages of the characteristics of the photovoltaic devices having a parallel resistance of 1 KΩ or more per 1 $cm^2$ such as the open circuit voltage (Voc), the short-circuit current (Jsc), the f(FF), and th(FF), and the photoelectric conversion efficiency (η) were measured by using a solar simulator at 25° C. irradiated with a pseudo solar light of AM 1.5 and 100 mW/$cm^2$. Results of measurements of the characteristics of the photovoltaic devices are shown in Table 5. However, the characteristics of the photovoltaic devices are standardized with respect to the values of Comparative Example 7 described below.

EXAMPLE 12

Twenty GaAs photovoltaic devices each having a diameter of 3 inches were manufactured by a method similar to that according to Example 11 except that an EVA layer 1201b containing $MgF_2$ and ZnS granules was not formed, i.e., only the EVA layer 1201c containing $MgF_2$ granules was formed. Similarly to Example 11, the characteristics of the photovoltaic devices were measured to obtain the average values.

COMPARATIVE EXAMPLE 7

Twenty GaAs photovoltaic devices each having a diameter of 3 inches were manufactured by a method similar to that according to Example 11 except that the granules were not contained in the EVA layer. Similarly to Example 11, the characteristics of the photovoltaic devices were measured to obtain the average values.

As can be seen from Table 5, the photovoltaic devices according to the present invention having an arrangement wherein the $MgF_2$ granules are contained in the surface protection layer had improved short-circuit current (Jsc) and photoelectric conversion efficiency (η). Furthermore, use of the surface protection layer containing the plural types of granules such as MgF$_2$ and ZnS according to Example 11 further improved the short-circuit current (Jsc) and the photoelectric conversion efficiency ($\eta$). In addition, the arrangement wherein the surface protection layer containing granules having small particle size and small volume density V in the surface protection layer had improved adhesion between the photovoltaic device, in which the front electrode 1205 and the other layers to be formed prior to forming the front electrode 1205 were formed, and the surface protection layer.

TABLE 5

| Example | Example 11 | Example 12 | Comparative Example 7 |
|---|---|---|---|
| Granules | Double Layer | Single Layer | No Layer |
| Voc | 1.000 | 1.000 | 1 |
| Jsc | 1.105 | 1.037 | 1 |
| FF | 1.001 | 1.001 | 1 |
| $\eta$ | 1.106 | 1.038 | 1 |

According to the present invention, when hard granules transparent with respect to visible light region are contained in the resin of the surface protection layer, the photovoltaic device is protected from scratching damage or the like and accordingly deterioration of the performance is prevented. Furthermore, the wear resistance can be improved. If a resin exhibiting a wide contact angle is used for the outermost surface layer on the light incident side, contamination of the photovoltaic device which occurs outdoors can be prevented. Furthermore, the incident light can be effectively utilized by selecting a combination of granules having an optimum refractive index and granule size. In addition, ultraviolet rays can be absorbed by the granules, causing the deterioration of the photovoltaic member due to light to be prevented. Moreover, the photo decomposition of silver paste resin or the like used in the front electrode can be prevented. Consequently, a photovoltaic device such as a solar cell module can be provided which exhibits excellent light resistance, bending resistance, flame resistance, weather resistance, and ease of mass production.

Furthermore, light which is incident on the photovoltaic device is scattered in the surface protection layer before the light is incident the semiconductor layer. Therefore, the length of the optical path in the semiconductor layer can be increased, the light absorption in the semiconductor can be enhanced, and the short-circuit current can be increased. As a result, the photoelectric conversion efficiency can be improved. Consequently, a photovoltaic device capable of stably outputting a high photoelectric conversion efficiency can be provided.

Moreover, the granules are dispersed sparsely adjacent to the outer surface and densely in the inner portion of the surface protection layer with respect to the direction of light incidence. Therefore, light can be further considerably scattered, the light absorption by the semiconductor layer can be enhanced, and the short-circuit current can be accordingly enlarged. As a result, the photoelectric conversion efficiency of the photovoltaic device can be further improved.

In addition, the fact that the granules are dispersed sparsely adjacent to the outer surface and densely in the inner portion of the surface protection layer with respect to the direction of light incidence improves the adhesion between the surface of the photovoltaic device, in which the front electrode and the other layers to be formed prior to forming the electrode are formed, and the surface protection layer.

Furthermore, the granules are formed into a plurality of layers in the surface protection layer. Therefore, incident light can be further effectively scattered, the light absorption by the semiconductor layer can be enhanced, and the short-circuit current is accordingly enlarged. As a result, the photoelectric conversion efficiency of the photovoltaic device can be further improved.

Furthermore, the arrangement wherein plural types of granules depending upon the material are simultaneously used further enhances scattering of incident light, the light absorption by the semiconductor layer thus being enhanced, and accordingly the short-circuit current is increased. As a result, the photoelectric conversion efficiency of the photovoltaic device can be further improved.

Moreover, the difference between the refractive index of the material of the granules and that of the material of the surface protection layer is selected to be 0.1 or more. Therefore, scattering of incident light is enhanced, light absorption by the semiconductor layer is enhanced, and accordingly the short-circuit current is increased. As a result, the photoelectric conversion efficiency of the photovoltaic device can be further improved.

In addition, the photovoltaic device according to the present invention has a long optical path in the semiconductor layer thereof. Therefore, the light absorption by the semiconductor layer can be enhanced. As a result, the thickness of the semiconductor layer can be reduced. Therefore, if an amorphous semiconductor is employed as the semiconductor layer, generation of defects which occurs in the semiconductor layer due to light can be prevented. Therefore, deterioration (so-called Staebler-Wronski deterioration) in the photoelectric conversion efficiency of the photovoltaic device due to light irradiation can be prevented.

If a crystalline semiconductor is used as the semiconductor layer, the thickness of the semiconductor substrate can be thinned. As a result, the weight of the photovoltaic device can be reduced, required material of the semiconductor can be reduced, and the cost of manufacturing the photovoltaic device can be reduced.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A method for producing a surface protecting layer on a photovoltaic device, said surface protecting layer containing granules and being provided at a light incident side of the photovoltaic device, comprising:

(a) applying to a surface of the photovoltaic device a plurality of liquid resins each containing granules which are different in diameter between the respective liquid resins;

(b) disposing said granules in a predetermined distribution state in the thickness direction of the protecting layer; and (c) curing the liquid resin.

2. A method for producing a surface protecting layer on a photovoltaic device, said surface protecting layer containing a resin and granules and is provided at a light incident side of the photovoltaic device, comprising: applying at least two sub-layers each comprising a resin and granules to form such surface protecting layer, said two sub-layers differing from each other in the distribution density of said granules contained in each.

3. A method for producing a surface protecting layer on a photovoltaic device, said surface protecting layer containing granules and is provided at a light incident side of the photovoltaic device, comprising:

(a) diffusing granules into a surface of a molten surface protection layer on a surface of said photovoltaic device; and (b) precipitating the granules.

4. A method for producing a surface protecting layer on a light incident side of a photovoltaic device said layer containing granules, which comprises applying over said light incident side at least two sublayers for forming the surface protecting layer, each containing resin and granules, wherein the particle sizes of the granules contained in each of the at least two sub-layers are different from those of the granules contained in the at least one other sub-layer.

5. A method for producing a surface protecting layer on a light incident side of a photovoltaic device, said layer containing granules, which comprises applying a first resin on the light incident side of the photovoltaic device, applying first granules on the surface of the first resin and applying a second resin on the granules and the first resin.

6. A method according to claim 5, further comprising applying second granules on the second resin and applying a third resin on the second granules and the second resin.

7. The method according to claim 6, wherein the particle sizes of the first and the second granules are different from each other.

8. The method according to claim 7, wherein the particle sizes of the second granules are larger than those of the first granules.

9. The method according to claim 8, wherein the granules are contained in the surface protecting layer such that the particles sizes of granules at an upper region are larger than those of granules at a lower region.

10. A method for producing a surface protecting layer on a light incident side a photovoltaic device, said layer containing granules, which comprises applying a liquid resin containing the granules on said light incident side of the photovoltaic device, the liquid resin having a specific gravity larger than that of the granules, and curing the liquid resin.

11. The method according to claim 10, wherein the granules comprise glass particles.

12. A photovoltaic device comprising:

(a) a semiconductor layer;

(b) a first electrode connected to one side of the semiconductor layer and a second electrode connected to the other side of the semiconductor layer; and (c) a surface protection layer provided at a light incident side of side device, wherein the surface protection layer comprises a plurality of layer regions each comprising a resin and granules of a material different from the material of the resin, and wherein the granules contained in adjacent layer regions are different in kind of material between the layer regions.

13. A photovoltaic device comprising:

(a) a semiconductor layer;

(b) a first electrode connected to one side of the semiconductor layer and a second electrode connected to the other side of the semiconductor layer; and (c) a surface protection layer provided at a light incident side of said device, wherein the surface protection layer comprises a first resin region comprising a first resin on said light incident side, a region comprising first granules of a material different from the material of the first resin on said first resin region, and a second resin region comprising a second resin of a material different from the material of the first granules on said region comprising first granules.

14. The device according to claim 13, further comprising on the second resin region another region comprising second granules of a material different from the material of the second resin, and a third resin region on said second granules comprising a third resin of a material different from the material of the second granules.

15. The device according to claim 14, wherein the particle sizes of the first and the second granules are different from each other.

16. The device according to claim 14, wherein the particles sizes of the second granules are larger than those of the first granules.

17. A photovoltaic device comprising:

(a) a semiconductor layer;

(b) a first electrode connected to one side of the semiconductor layer and a second electrode, connected to the other side of the semiconductor layer, and (c) a surface protection layer provided at a light incident side of said device, wherein the surface protection layer comprises a resin and granules contained in the resin in a predetermined distribution state in the layer thickness direction thereof, and wherein the granules have a specific gravity smaller than that of the resin.

18. A photovoltaic device comprising:

(a) a semiconductor layer;

(b) a first electrode connected to one side of the semiconductor layer and a second electrode connected to the other side of the semiconductor layer; and (c) a surface protection layer provided at a light incident side of said device, wherein the surface protection layer comprises a plurality of layer regions each comprising a resin and granules of a material different from the material of the resin, wherein the granules contained in adjacent layer regions are different in kind of material between the layer regions, and wherein the particle size of granules at an upper region are larger than those of granules at a lower region.

19. A photovoltaic device comprising:

(a) a semiconductor layer;

(b) a first electrode connected to one side of the semiconductor layer and a second electrode connected to the other side of the semiconductor layer; and (c) a surface protection layer provided at a light incident side of said device, wherein the surface protection layer comprises a plurality of layer regions each comprising a resin and granules of a material different from the material of the resin, and wherein the adjacent layer regions are different in quantity of granules per unit volume from each other, wherein the difference in quantity of granules per unit volume is obtained by changing the quantity of said granules added per unit volume in the layer region.

20. The device according to claim 19, wherein the quantity of said granules per unit volume is smaller at the side of the surface.

* * * * *

UNITED STATES PATENT AND TRADEMARK OFFICE
CERTIFICATE OF CORRECTION

PATENT NO. : 5,656,098

DATED : August 12, 1997

INVENTOR(S): NOBUYUKI ISHIKAWA ET AL.

It is certified that error appears in the above-identified patent and that said Letters Patent is hereby corrected as shown below:

TITLE PAGE AT [56]
   References Cited, After "A. Rothwarf": "(1985 pp 809-812." should read --(1985) pp. 809-812.--.

TITLE PAGE AT [57]
   Line 1, "layer;" should read --layer,--.

COLUMN 1
   Line 59, "0,127" should read --0.127--.

COLUMN 2
   Line 6, "in" should read --is--.

COLUMN 3
   Line 20, "if" should read --of--.

COLUMN 7
   Line 7, "$Na_3, AlF_6,$" should read-- $Na_3AlF_6,$ --

COLUMN 8
   Line 11, "of" (second occurrence) should read --of the--;
   Line 60, "(1) i-type layer" should read --¶ (1) i-type layer--.

COLUMN 9
   Line 45, "follows:" should read --as follows--.

UNITED STATES PATENT AND TRADEMARK OFFICE
CERTIFICATE OF CORRECTION

PATENT NO. : 5,656,098

DATED : August 12, 1997

INVENTOR(S): NOBUYUKI ISHIKAWA ET AL.

It is certified that error appears in the above-identified patent and that said Letters Patent is hereby corrected as shown below:

COLUMN 10
   Line 9, "a-SiC:E," should read --a-SiC:HX,--;
   Line 10, "a-SiON:E," should read --a-SiON:HX,--.

COLUMN 11
   Line 43, "$Si_3H_3$," should read --$Si_3H_8$,--;
   Line 47, delete" $GeFH_3$," second occurrence;
   Line 47, "$GeED_3$," should read --$GeHD_3$,--

COLUMN 13
   Line 15, "27 The" should read --The--;
   Line 59 "deaerated," should read --de-aerated,--.

COLUMN 14
   Line 33, "$BF_s$," should read --$BF_3$,--;
   Line 36, "player" should read --p-layer--;
   Line 50, "(MgO 0:0.05 wt%) should read --(MgO:0.05 wt%)--.

COLUMN 15
   Line 2, "25.4 nm" should read --25.4 um--.
   Line 4, "(3) Taper-Type" should read --¶ (3) Taper-Type--.
   Line 54, "MgO.MNaF" should read --MgO·MNaF--.

COLUMN 17
   Line 5, "$ThO_2 \cdot YO_3$" should read --$ThO_2 \cdot Y_2O_3$--.

UNITED STATES PATENT AND TRADEMARK OFFICE
CERTIFICATE OF CORRECTION

PATENT NO. : 5,656,098

DATED : August 12, 1997

INVENTOR(S): NOBUYUKI ISHIKAWA ET AL.

It is certified that error appears in the above-identified patent and that said Letters Patent is hereby corrected as shown below:

COLUMN 20
  Line 23, "took" should read --takes--.

COLUMN 21
  Line 46, "PJnax" should read --Rmax--.

COLUMN 23
  Line 65, "from" should read --from the--.

COLUMN 26
  Line 2, "n+type" should read --$n^+$ type--;
  Line 10, "Then," should read --Then, a--.

COLUMN 27
  Line 62, "Then," should read --Then, a--.

COLUMN 28
  Line 10, "MgF2" should read --$MgF_2$--;
  Line 26, "has" should read --was--;
  Line 36, "the f(FF), and th(FF)," should read --the fill factor (FF),--.

COLUMN 29
  Line 23, "to" should read --to the--;
  Line 29, "accordingly" should read --accordingly,--.

UNITED STATES PATENT AND TRADEMARK OFFICE
CERTIFICATE OF CORRECTION

PATENT NO. : 5,656,098

DATED : August 12, 1997

INVENTOR(S): NOBUYUKI ISHIKAWA ET AL.

It is certified that error appears in the above-identified patent and that said Letters Patent is hereby corrected as shown below:

COLUMN 31
  Line 5, "is" should read --being--;
  Line 12, "device" should read --device,--;
  Line 14, "sublayers" should read --sub-layers--;
  Line 36, "particles" should read --particle--;
  Line 39, "a" should read --of a--;
  Line 54, "side" (second occurrence) should read --said--.

COLUMN 32
  Line 18, "ticles" should read --ticle--;
  Line 25, "layer," should read --layer;--.

Signed and Sealed this

Twelfth Day of May, 1998

Attest:

BRUCE LEHMAN

Attesting Officer

Commissioner of Patents and Trademarks